(12) United States Patent
Haneda

(10) Patent No.: US 11,901,392 B2
(45) Date of Patent: *Feb. 13, 2024

(54) SEMICONDUCTOR DEVICE AND METHOD OF MANUFACTURING SEMICONDUCTOR DEVICE

(71) Applicant: SONY SEMICONDUCTOR SOLUTIONS CORPORATION, Kanagawa (JP)

(72) Inventor: Masaki Haneda, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/046,418

(22) Filed: Oct. 13, 2022

(65) Prior Publication Data

US 2023/0073800 A1 Mar. 9, 2023

Related U.S. Application Data

(63) Continuation of application No. 17/252,926, filed as application No. PCT/JP2019/023520 on Jun. 13, 2019, now Pat. No. 11,515,351.

(30) Foreign Application Priority Data

Jun. 27, 2018 (JP) ................................. 2018-121524

(51) Int. Cl.
  *H01L 21/768* (2006.01)
  *H01L 27/146* (2006.01)
  (Continued)

(52) U.S. Cl.
  CPC .. *H01L 27/14636* (2013.01); *H01L 21/76831* (2013.01); *H01L 23/528* (2013.01); *H01L 23/5226* (2013.01); *H01L 27/14634* (2013.01)

(58) Field of Classification Search
  CPC ......... H01L 27/00; H01L 7/088; H01L 7/146; H01L 7/1469; H01L 7/14634;
  (Continued)

(56) References Cited

U.S. PATENT DOCUMENTS 7,138,670 B2   11/2006   Miwa et al.
9,553,093 B1   1/2017    Seo
(Continued)

FOREIGN PATENT DOCUMENTS

CN   1388989 A      1/2003
CN   103247597 A    8/2013
(Continued)

OTHER PUBLICATIONS

Fischer, et al., "Low-k interconnect stack with multi-layer air gap and tri-metal-insulator-metal capacitors for 14 nm high volume manufacturing", 2015 IEEE International Interconnect Technology Conference and 2015 IEEE Materials or Advanced Metallization Conference (IITC/MAM), Nov. 12, 2015, 4 pages.

(Continued)

*Primary Examiner* — Chuong A Luu
(74) *Attorney, Agent, or Firm* — CHIP LAW GROUP

(57) ABSTRACT

There is provided a semiconductor device in which the inter-wiring capacitance of wiring lines provided in any layout is further reduced. A semiconductor device that includes a first inter-wiring insulating layer that is provided on a substrate and includes a recess on a side opposite to the substrate, a first wiring layer that is provided inside the recess in the first inter-wiring insulating layer, a sealing film that is provided along an uneven shape of the first wiring layer and the first inter-wiring insulating layer, a second inter-wiring insulating layer that is provided on the first inter-wiring insulating layer to cover the recess, and a gap that is provided between the second inter-wiring insulating (Continued)

layer and the first wiring layer and the first inter-wiring insulating layer. The second inter-wiring insulating layer has a planarized surface that is opposed to the recess.

20 Claims, 21 Drawing Sheets

(51) Int. Cl.
   *H01L 23/522* (2006.01)
   *H01L 23/528* (2006.01)
(58) Field of Classification Search
   CPC . H01L 7/14636; H01L 23/522; H01L 23/528; H01L 23/532; H01L 23/5222; H01L 23/5226; H01L 23/498; H01L 23/5384; H01L 23/49827; H01L 23/53295; H01L 21/768; H01L 21/76801; H01L 21/7682; H01L 21/8234; H01L 21/76831; H01L 2224/4557; H01L 2224/45578; H01L 2224/45565; H04N 25/70; H04N 25/76
   USPC ........................................................ 257/443
   See application file for complete search history.

(56) References Cited

U.S. PATENT DOCUMENTS

| | | | |
|---|---|---|---|
| 11,515,351 B2* | 11/2022 | Haneda | ............ H01L 27/14636 |
| 2003/0222349 A1 | 12/2003 | Tomohisa | |
| 2005/0142824 A1 | 6/2005 | Kim | |
| 2005/0173798 A1 | 8/2005 | Nakamura et al. | |
| 2009/0302473 A1 | 12/2009 | Shibata | |
| 2010/0055893 A1 | 3/2010 | Watanabe | |
| 2012/0319279 A1 | 12/2012 | Isobayashi | |
| 2013/0207269 A1 | 8/2013 | Oshida | |
| 2014/0191242 A1 | 7/2014 | Nie et al. | |
| 2015/0028491 A1 | 1/2015 | Angyal et al. | |
| 2017/0186668 A1 | 6/2017 | Wu et al. | |
| 2018/0240834 A1 | 8/2018 | Tanaka et al. | |
| 2019/0181168 A1 | 6/2019 | Kawashima | |

FOREIGN PATENT DOCUMENTS

| | | |
|---|---|---|
| CN | 107408567 A | 11/2017 |
| CN | 109328395 A | 2/2019 |
| DE | 112017004206 T5 | 5/2019 |
| JP | 08-125016 A | 5/1996 |
| JP | 10-247648 A | 9/1998 |
| JP | 2013-165147 A | 8/2013 |
| JP | 2018-092991 A | 6/2018 |
| KR | 10-2019-0040934 A | 4/2019 |
| TW | 200527496 A | 8/2005 |
| TW | 201349411 A | 12/2013 |
| WO | 2016/158440 A1 | 10/2016 |
| WO | 2018/037667 A1 | 3/2018 |

OTHER PUBLICATIONS

International Search Report and Written Opinion of PCT Application No. PCT/JP2019/023520, dated Aug. 13, 2019, 11 pages of English Translation and 10 pages of ISRWO.
Notice of Allowance for U.S. Appl. No. 17/252,926, dated Jul. 27, 2022, 5 pages.
Notice of Allowance for U.S. Appl. No. 17/252,926, dated Jul. 13, 2022, 9 pages.
International Preliminary Report on Patentability of PCT Application No. PCT/JP2019/023520, dated Jan. 7, 2021, 11 pages of English Translation and 07 pages of IPRP.

* cited by examiner

[FIG. 1]
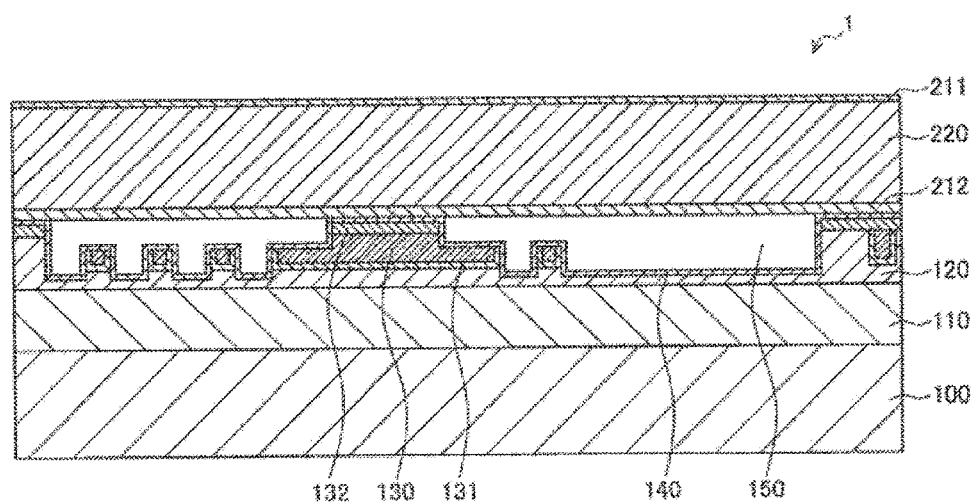

[FIG. 2]
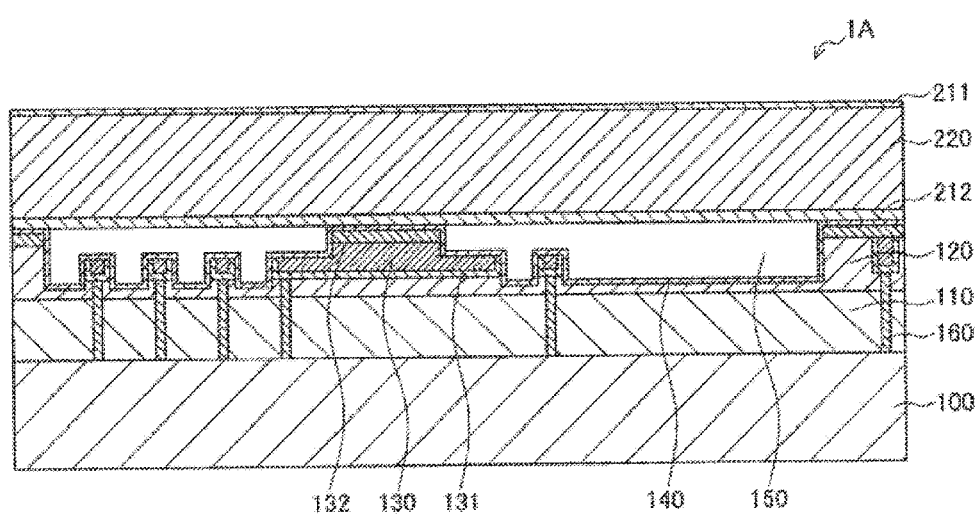

[FIG. 3]
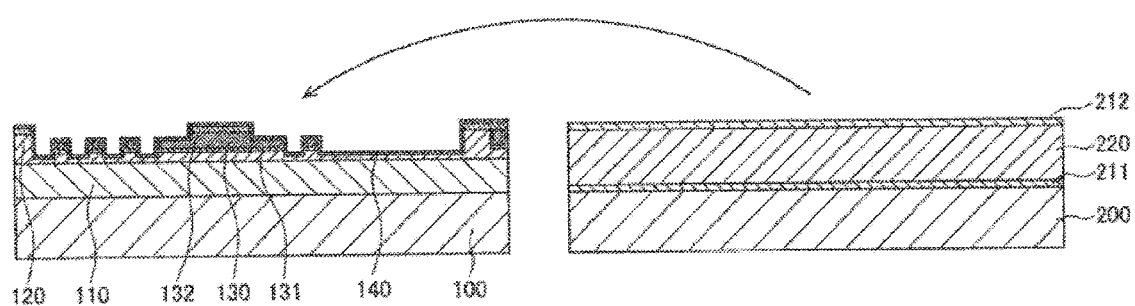

[FIG. 4A]
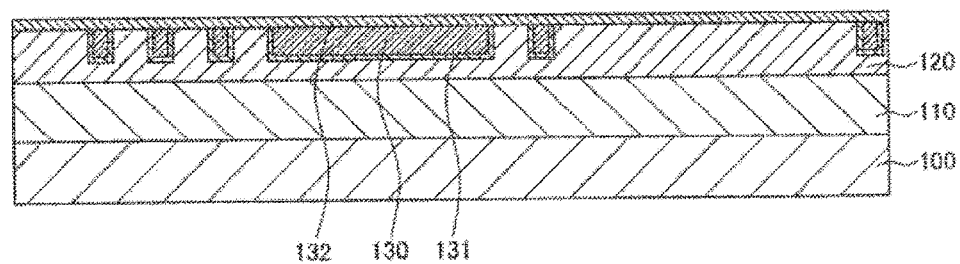

[FIG. 4B]
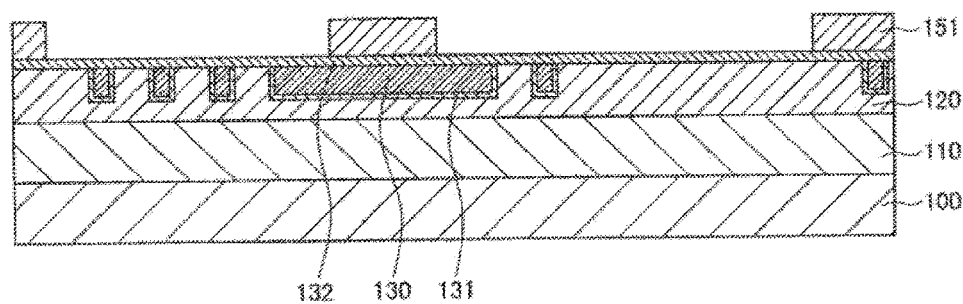

[FIG. 4C]
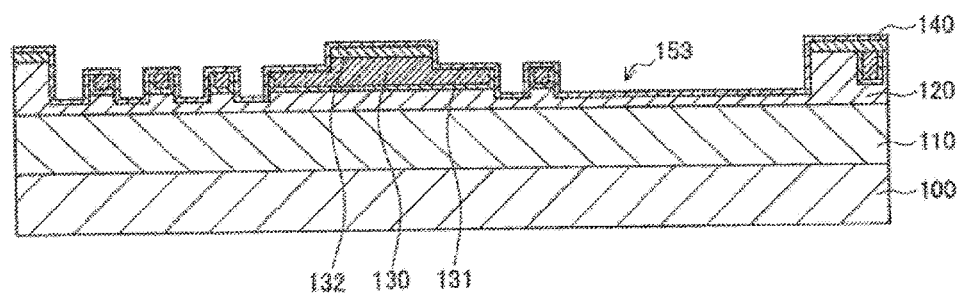

[FIG. 4D]
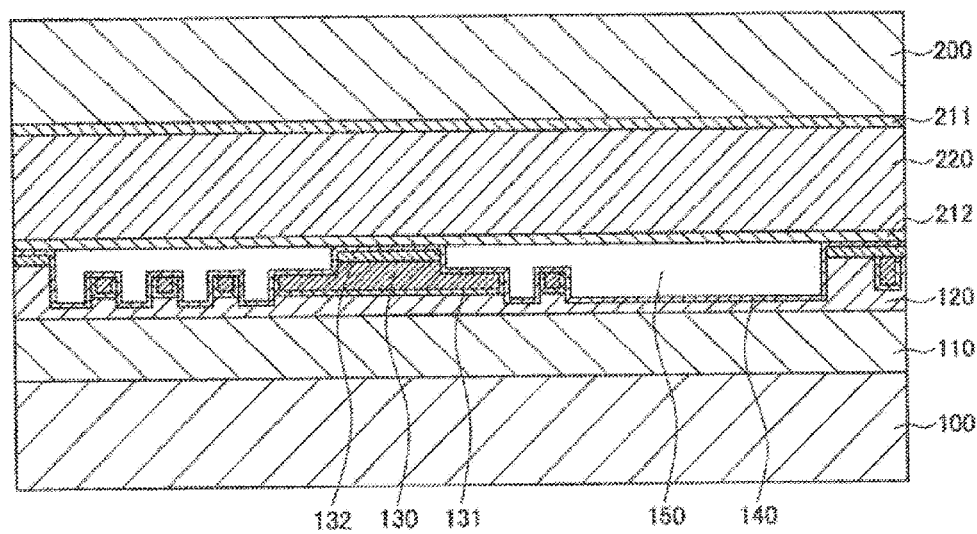

[FIG. 5A]
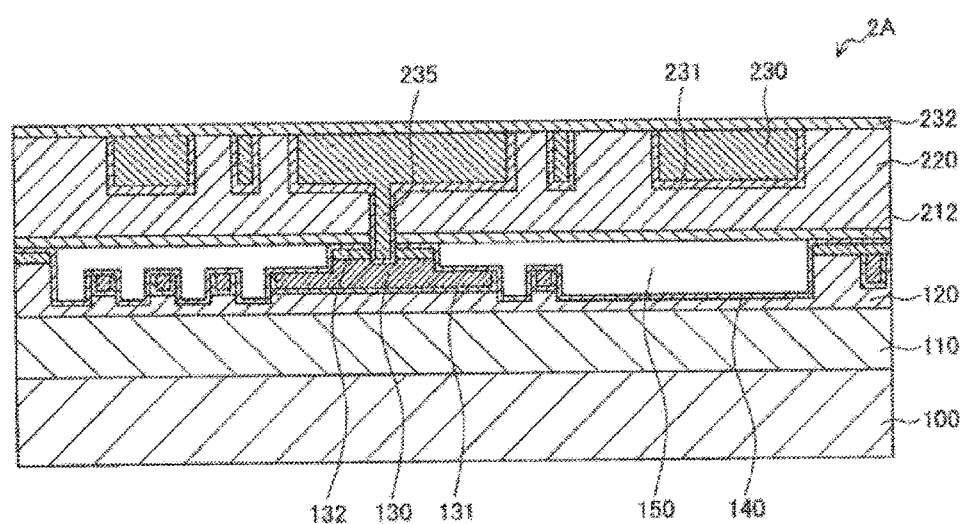

[FIG. 5B]
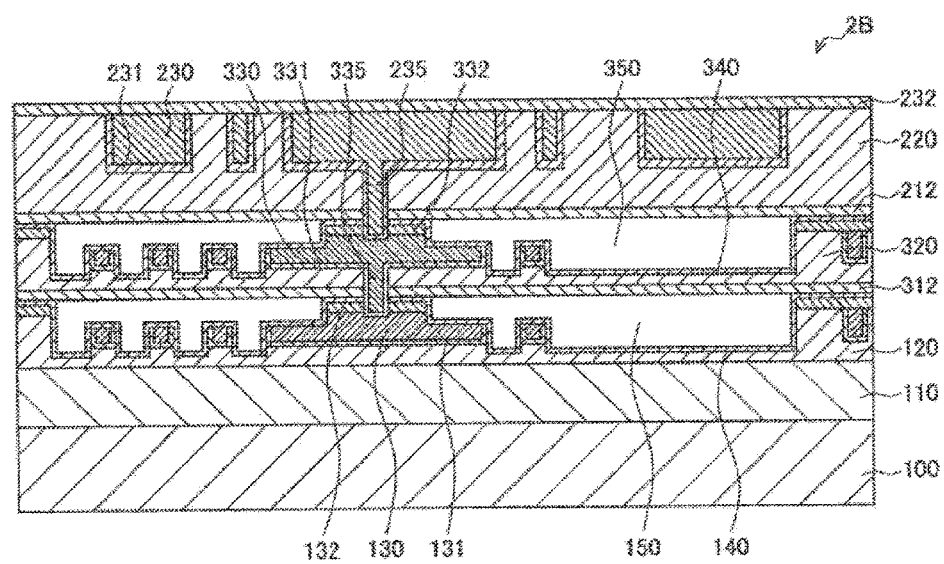

[FIG. 5C]
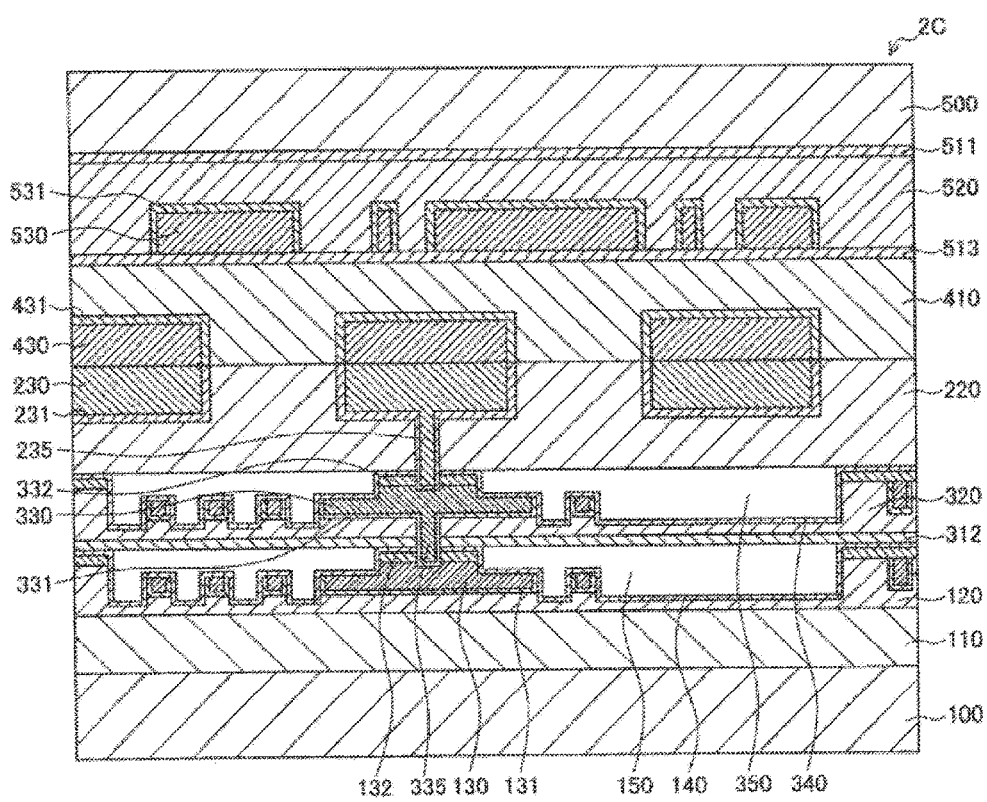

[FIG. 6A]
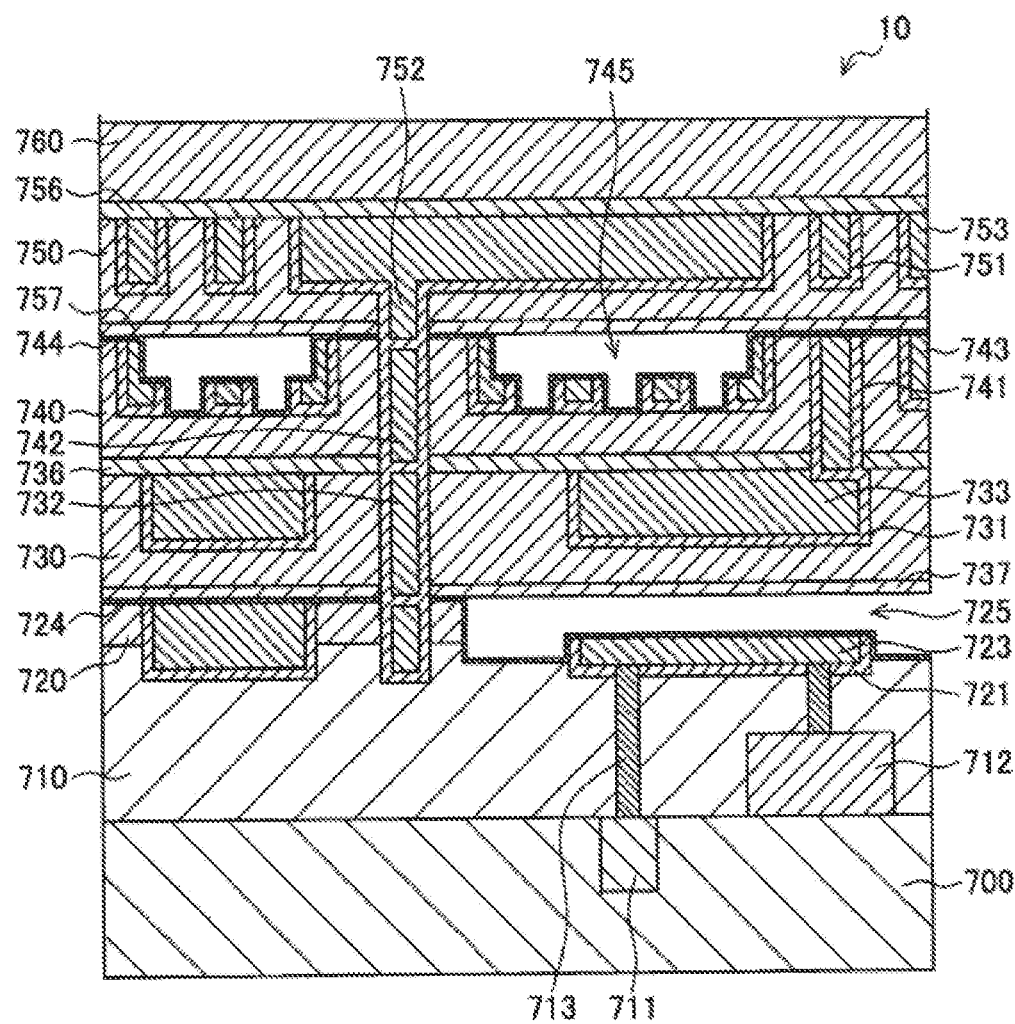

[FIG. 6B]
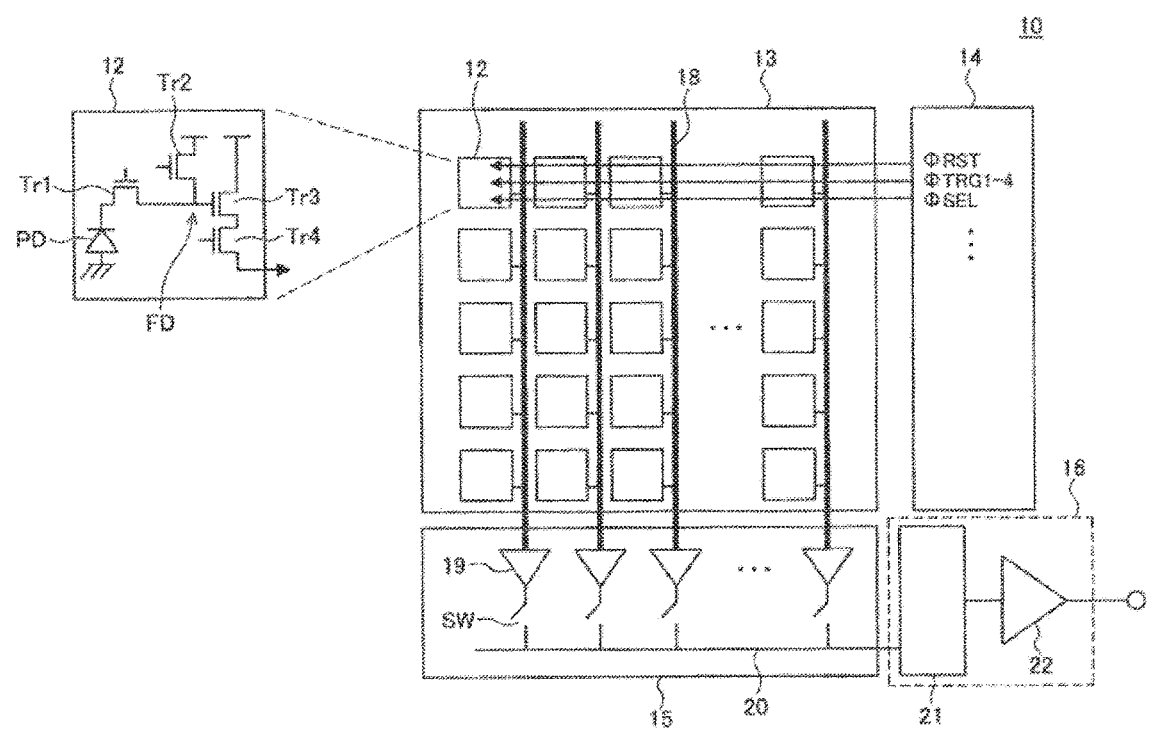

[FIG. 7A]
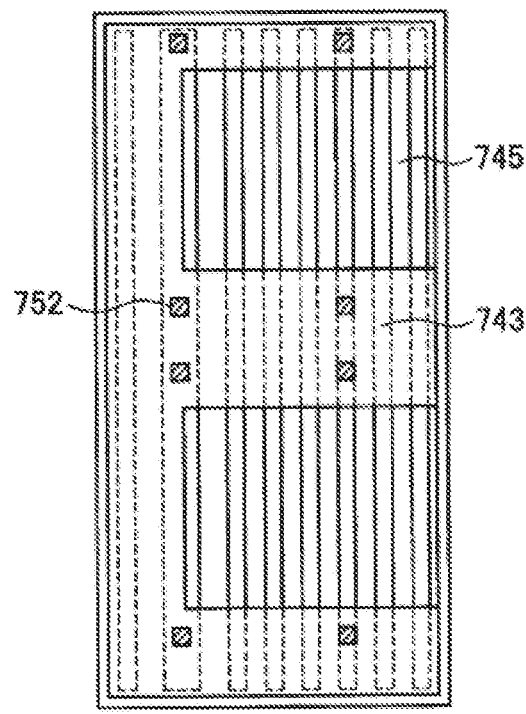

[FIG. 7B]
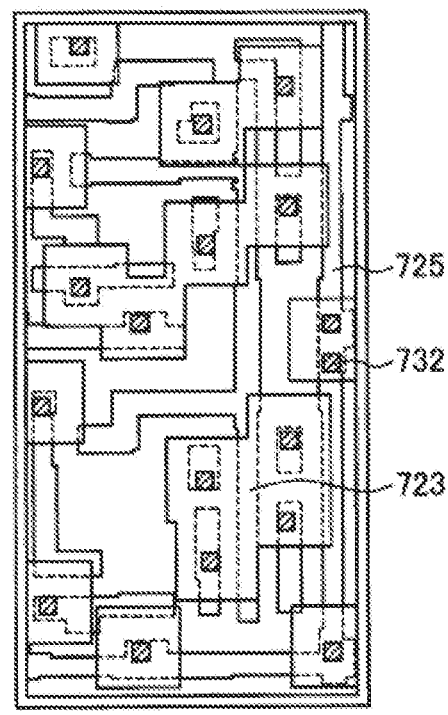

[FIG. 8]
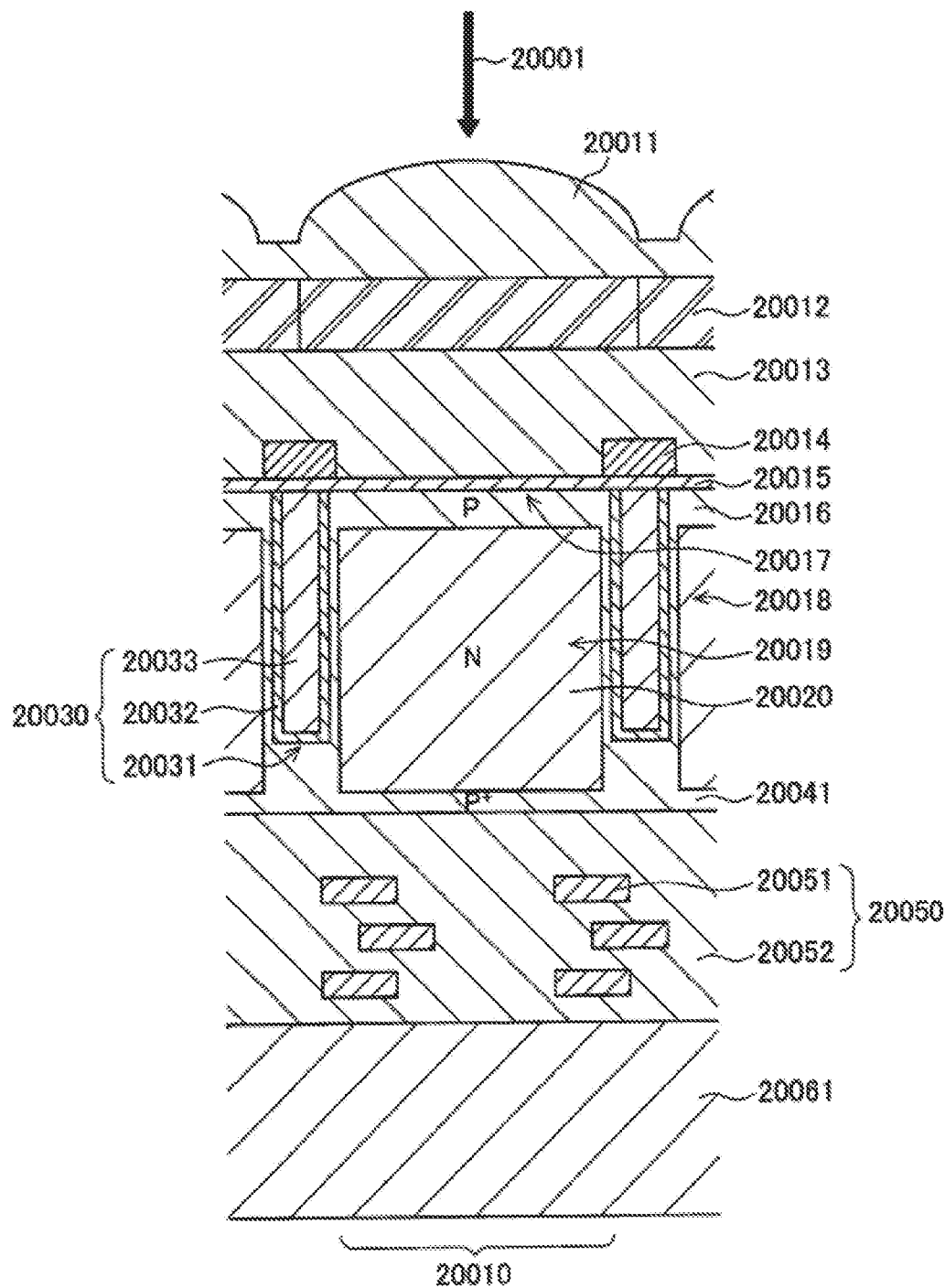

[FIG. 9]
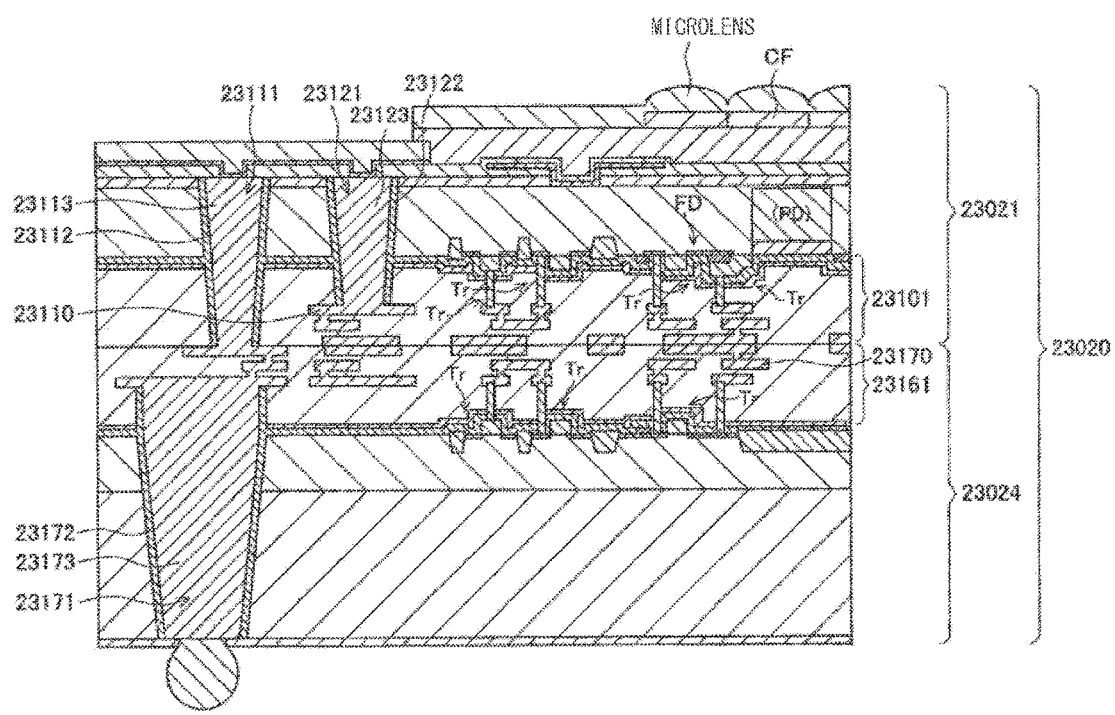

[FIG. 10]
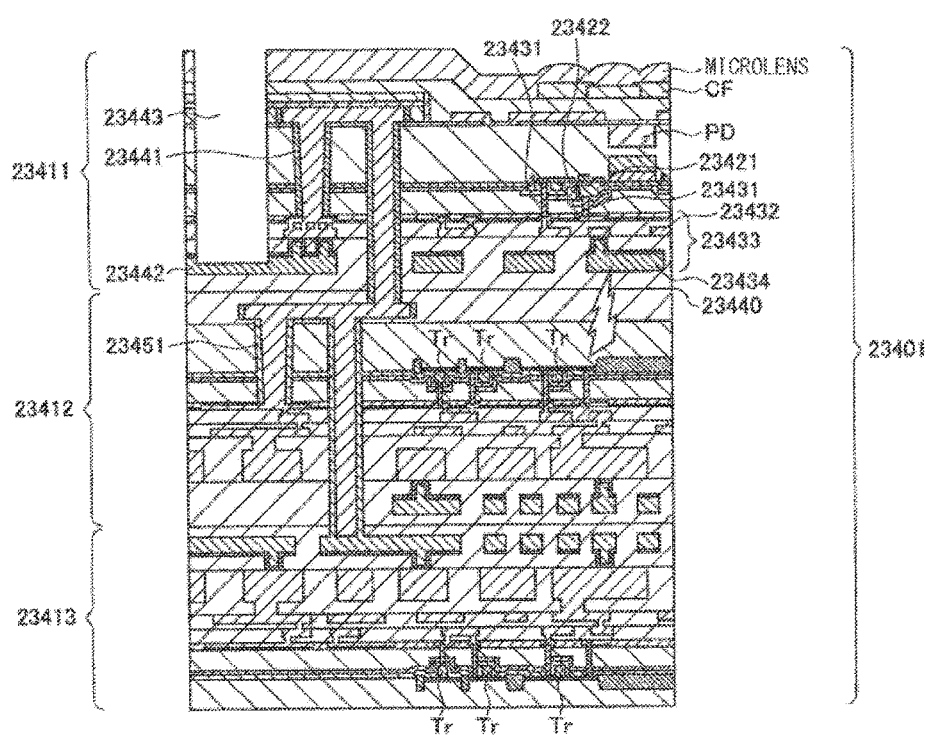

[FIG. 11]
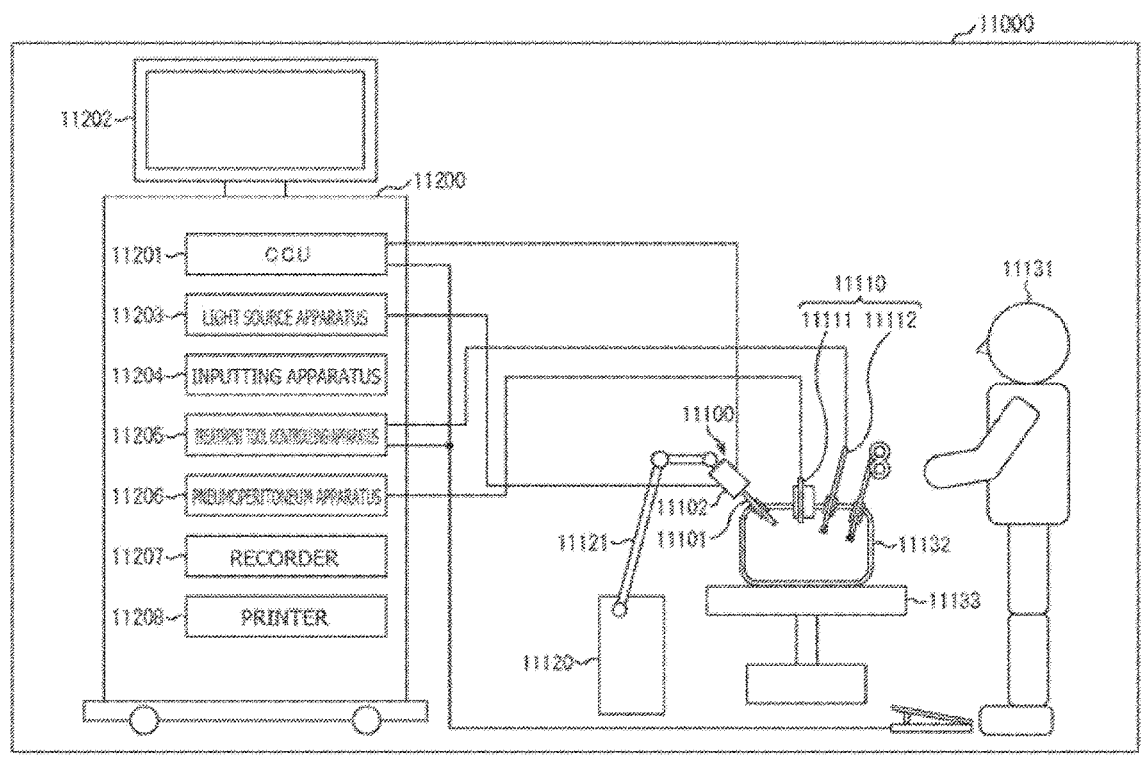

[FIG. 12]
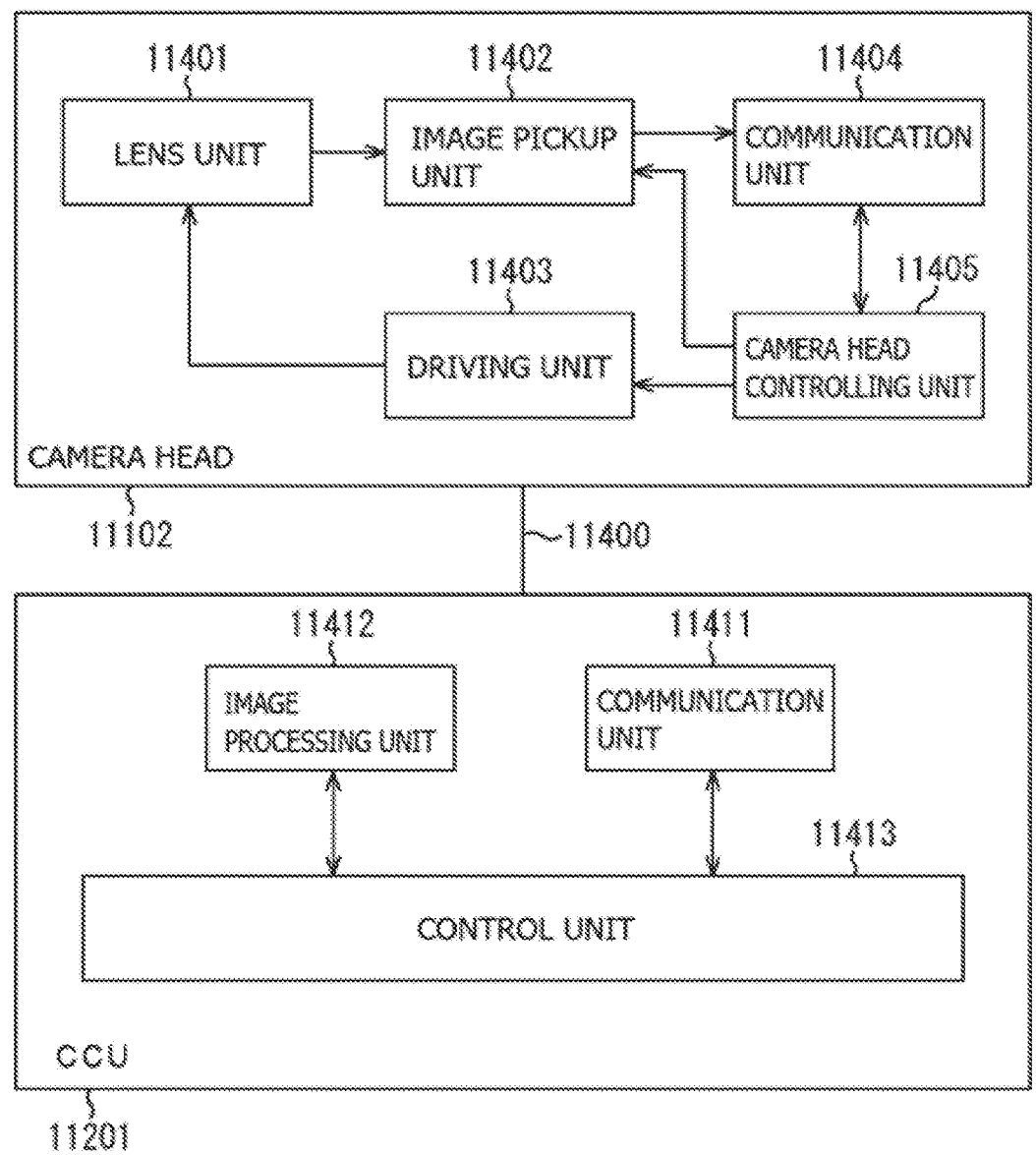

[FIG. 13]
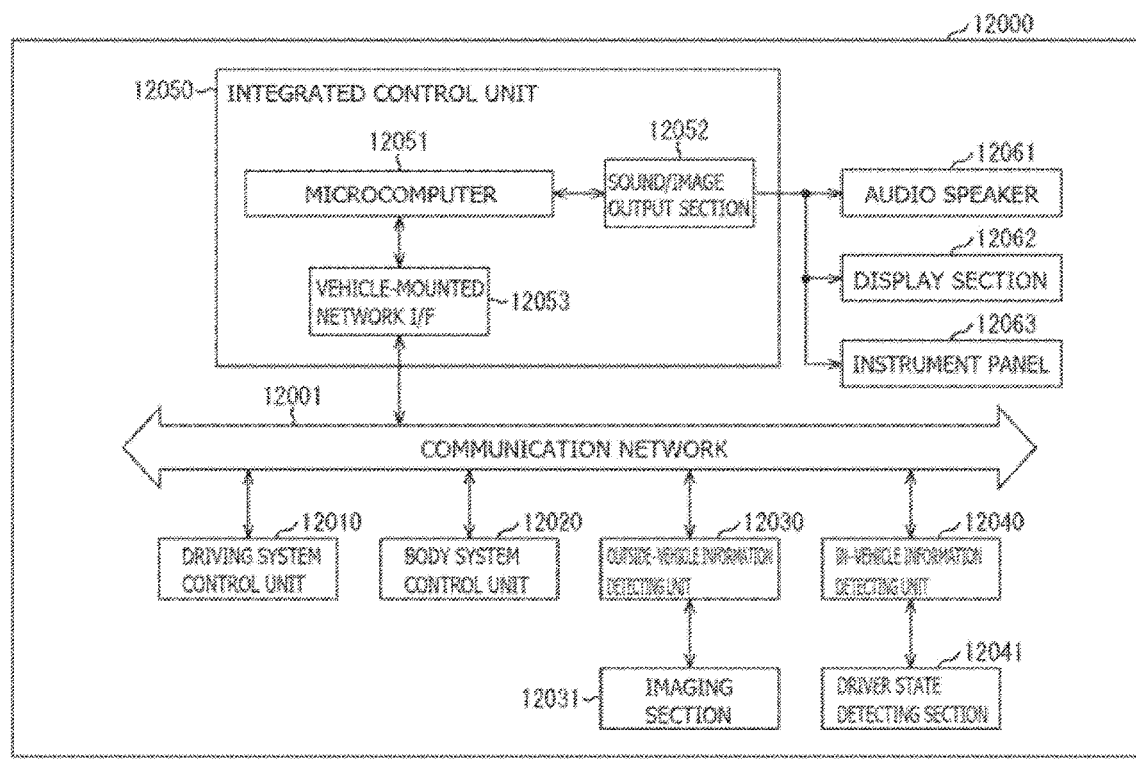

[FIG. 14]
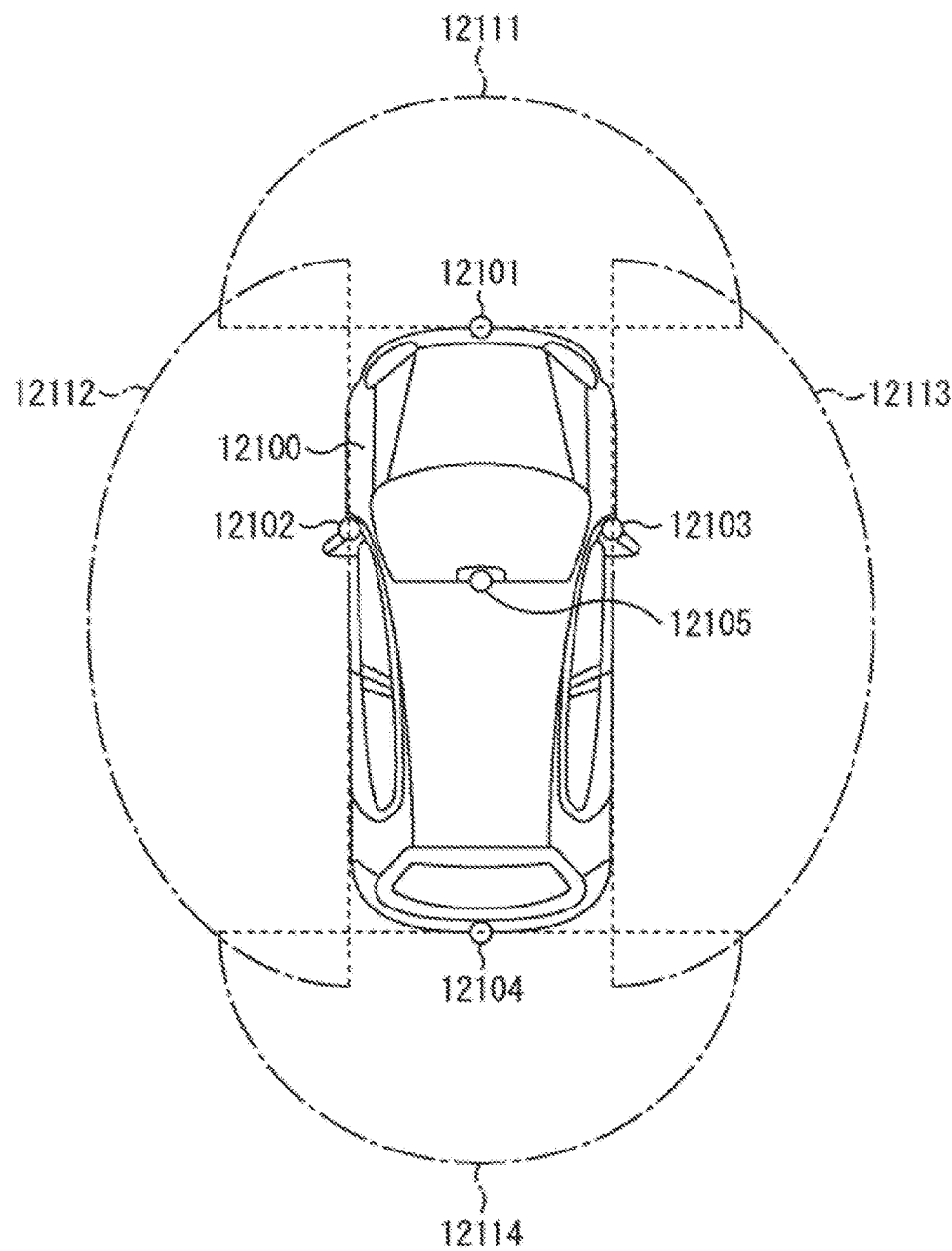

SEMICONDUCTOR DEVICE AND METHOD OF MANUFACTURING SEMICONDUCTOR DEVICE

CROSS REFERENCE TO RELATED APPLICATIONS

This application is a continuation application of U.S. patent application Ser. No. 17/252,926, filed on Dec. 16, 2020, which is a U.S. National Phase of International Patent Application No PCT/JP2019/023520 filed on Jun. 13, 2019, which claims priority the benefit of Japanese Patent Application No. JP 2018-121524 filed in the Japan Patent Office on Jun. 27, 2018. Each of the above-referenced applications is hereby incorporated herein by reference in its entirety.

TECHNICAL FIELD

The present disclosure relates to a semiconductor device and a method of manufacturing a semiconductor device.

BACKGROUND ART

In recent years, finer wiring lines of semiconductor devices each have increased the wire delay, which decreases the operation speed of the semiconductor device. Specifically, finer wiring lines have smaller cross-sectional area and higher wiring resistance. This increases delay (also referred to as RC delay), which is proportional to the product of the wiring resistance and the inter-wiring capacitance.

It is therefore considered to decrease the dielectric constant between the wiring lines to reduce the inter-wiring capacitance. Specifically, it is considered to further reduce the dielectric constant between the wiring lines by removing the insulating material between the wiring lines to provide a gap (also referred to as air gap) having a specific dielectric constant of 1 between the wiring lines.

For example, NPTL 1 below discloses a method of forming a gap between wiring lines by using non-conformal deposition film formation such as CVD (Chemical Vapor Deposition) to place deposits above the wiring lines before the space between the wiring lines is filled with a deposit.

CITATION LIST

Non-Patent Literature

NPTL 1: K. Fischer, et. al., "Low-k interconnect stack with multi-layer air gap and tri-metal-insulator-metal capacitors for 14 nm high volume manufacturing", 2015 IEEE International Interconnect Technology Conference and 2015 IEEE Materials for Advanced Metallization Conference (IITC/MAM), 2015

SUMMARY OF THE INVENTION

Problems to be Solved by the Invention

The technology disclosed in NPTL 1 has more difficulty in forming a gap between wiring line as the wiring lines have a longer distance because the space between the wiring lines is filled with a deposit. This requires technology that allows a gap to be formed between wiring lines in any layout regardless of the distance between the wiring lines.

Accordingly, the present disclosure proposes a novel and improved semiconductor device and method of manufacturing a semiconductor device that allows the inter-wiring capacitance of wiring lines provided in any layout to be reduced.

Means for Solving the Problems

According to the present disclosure, there is provided a semiconductor device including: a first inter-wiring insulating layer that is provided on a substrate and includes a recess on a side opposite to the substrate; a first wiring layer that is provided inside the recess in the first inter-wiring insulating layer; a sealing film that is provided along an uneven shape of the first wiring layer and the first inter-wiring insulating layer; a second inter-wiring insulating layer that is provided on the first inter-wiring insulating layer to cover the recess; and a gap that is provided between the second inter-wiring insulating layer and the first wiring layer and the first inter-wiring insulating layer. The second inter-wiring insulating layer has a planarized surface that is opposed to the recess.

In addition, according to the present disclosure, there is provided a method of manufacturing a semiconductor device. The method includes: forming a first inter-wiring insulating layer on a substrate; forming a recess in the first inter-wiring insulating layer and exposing the first wiring layer inside the recess; providing a sealing film along an uneven shape of the first wiring layer and the first inter-wiring insulating layer; and providing a second inter-wiring insulating layer on the first inter-wiring insulating layer to cover the recess and forming a gap between the second inter-wiring insulating layer and the first wiring layer and the first inter-wiring insulating layer. The first inter-wiring insulating layer has a first wiring layer embedded on a side opposite to the substrate. The second inter-wiring insulating layer has a planarized surface that is opposed to the recess.

According to the present disclosure, the uneven surface of the first inter-wiring insulating layer and the planarized surface of the second inter-wiring insulating layer are bonded together, thereby making it possible to provide a gap inside the recess in the first inter-wiring insulating layer. In a semiconductor device 1, it is thus possible to provide a gap around the first wiring layers provided in any layout inside the recess in the first inter-wiring insulating layer.

Effects of the Invention

According to the present disclosure as described above, it is possible to provide the semiconductor device in which the inter-wiring capacitance of the wiring lines provided in any layout is further reduced.

It is to be noted that the above-described effects are not necessarily limitative. Any of the effects indicated in this description or other effects that may be understood from this description may be attained in addition to the above-described effects or in place of the above-described effects.

BRIEF DESCRIPTION OF DRAWING

FIG. 1 is a vertical cross-sectional view schematically illustrating a structure example of a semiconductor device according to a first embodiment of the present disclosure.

FIG. 2 is a vertical cross-sectional view schematically illustrating a structure example in which a through via is formed in an inter-layer insulating film in the semiconductor device in FIG. 1.

FIG. 3 is a schematic vertical cross-sectional view describing an overview of a method of manufacturing the semiconductor device according to the embodiment.

FIG. 4A is a schematic vertical cross-sectional view describing a step of the method of manufacturing the semiconductor device according to the embodiment.

FIG. 4B is a schematic vertical cross-sectional view describing a step of the method of manufacturing the semiconductor device according to the embodiment.

FIG. 4C is a schematic vertical cross-sectional view describing a step of the method of manufacturing the semiconductor device according to the embodiment.

FIG. 4D is a schematic vertical cross-sectional view describing a step of the method of manufacturing the semiconductor device according to the embodiment.

FIG. 5A is a vertical cross-sectional view schematically illustrating a structure example of a semiconductor device according to a first modification example.

FIG. 5B is a vertical cross-sectional view schematically illustrating a structure example of a semiconductor device according to a second modification example.

FIG. 5C is a vertical cross-sectional view schematically illustrating a structure example of a semiconductor device according to a third modification example.

FIG. 6A is a vertical cross-sectional view schematically illustrating a first structure example of a solid-state imaging device according to a second embodiment of the present disclosure.

FIG. 6B is an explanatory diagram schematically illustrating a pixel circuit of the solid-state imaging device according to the embodiment.

FIG. 7A is a planar cross-sectional view schematically illustrating planar disposition of the first structure example of the solid-state imaging device according to the embodiment.

FIG. 7B is a planar cross-sectional view schematically illustrating the planar disposition of the first structure example of the solid-state imaging device according to the embodiment.

FIG. 8 is a vertical cross-sectional view schematically illustrating a second structure example of the solid-state imaging device according to the embodiment.

FIG. 9 is a vertical cross-sectional view schematically illustrating a third structure example of the solid-state imaging device according to the embodiment.

FIG. 10 is a vertical cross-sectional view schematically illustrating a fourth structure example of the solid-state imaging device according to the embodiment.

FIG. 11 is a view depicting an example of a schematic configuration of an endoscopic surgery system.

FIG. 12 is a block diagram depicting an example of a functional configuration of a camera head and a camera control unit (CCU).

FIG. 13 is a block diagram depicting an example of schematic configuration of a vehicle control system.

FIG. 14 is a diagram of assistance in explaining an example of installation positions of an outside-vehicle information detecting section and an imaging section.

MODES FOR CARRYING OUT THE INVENTION

The following describes a preferred embodiment of the present disclosure in detail with reference to the accompanying drawings. It is to be noted that, in this description and the drawings, components that have substantially the same functional configuration are indicated by the same reference signs and redundant description thereof is thus omitted.

In each diagram referred to in the following description, the size of some of the constituent members is exaggerated for convenience of description. Accordingly, the relative size of the components illustrated in each diagram does not necessarily express the size relationship between the actual constituent members with accuracy. In addition, the following description sometimes expresses the direction in which substrates or layers are stacked as an up direction.

It is to be noted that description is given in the following order.

1. First Embodiment
  1.1. Structure Example of Semiconductor Device
  1.2. Example of Method of Manufacturing Semiconductor Device
  1.3. Modification Examples of Semiconductor Device
2. Second Embodiment
  2.1. First Structure Example of Solid-State Imaging Device
  2.2. Second Structure Example of Solid-State Imaging Device
  2.3. Third Structure Example of Solid-State Imaging Device
  2.4. Fourth Structure Example of Solid-State Imaging Device
3. Application Examples

1. First Embodiment

1.1. Structure Example of Semiconductor Device

First, a structure example of a semiconductor device according to a first embodiment of the present disclosure is described with reference to FIGS. 1 and 2. FIG. 1 is a vertical cross-sectional view schematically illustrating a structure example of the semiconductor device according to the first embodiment of the present disclosure.

As illustrated in FIG. 1, a semiconductor device 1 includes a substrate 100, an inter-layer insulating film 110, a first inter-wiring insulating layer 120, a first wiring layer 130, a barrier layer 131, a cap layer 132, a sealing film 140, a second inter-wiring insulating layer 220, and an inter-layer insulating films 211 and 212. In the semiconductor device 1, a gap 150 is formed by the planarized surface of the second inter-wiring insulating layer 220 and the uneven shape of the first inter-wiring insulating layer 120 and the first wiring layer 130.

The substrate 100 is a support provided with each component of the semiconductor device 1. Specifically, as long as the substrate 100 is a plate member having rigidity and a planarized surface, a publicly known substrate is usable. Alternatively, it is possible to use various glass substrates, resin substrates, semiconductor substrates, or the like. For example, the substrate 100 may be a glass substrate formed by using high strain point glass, soda glass, borosilicate glass, sapphire glass, quartz glass, or the like. The substrate 100 may be a resin substrate formed by using a resin such as polymethyl methacrylate, polyvinyl alcohol, polyimide, or polycarbonate. The substrate 100 may be a semiconductor substrate formed by using Si, Ge, GaAs, GaN, SiC, or the like.

The inter-layer insulating film 110 is provided on the substrate 100 and separates the substrate 100 and the first wiring layer 130 from each other. Specifically, in a case where the substrate 100 is a semiconductor substrate, the inter-layer insulating film 110 electrically insulates various elements such as transistors formed on the substrate 100 and the first wiring layers 130 to prevent them from being conductive to each other. In addition, the inter-layer insulating film 110 may be provided to prevent each component formed on the inter-layer insulating film 110 from being influenced by the surface shape of the substrate 100. For example, the inter-layer insulating film 110 may include a low-dielectric-constant material (so-called low-k material) such as carbon-doped $SiO_2$ or porous silica or an insulating material such as $SiO_2$, SiCN, SiN, SiOC, or SiOCN.

It is to be noted that, in a case where the substrate 100 is a semiconductor substrate, parasitic capacitance is generated between the substrate 100 and the first wiring layer 130. To reduce such parasitic capacitance, the inter-layer insulating film 110 may include a low-dielectric-constant material (so-called low-k material).

The first inter-wiring insulating layer 120 includes an insulating material and is provided on the inter-layer insulating film 110. The first inter-wiring insulating layer 120 supports the second inter-wiring insulating layer 220 to form the stacked structure of the semiconductor device 1. In addition, a recess including the first wiring layers 130 therein is formed in the first inter-wiring insulating layer 120. The first inter-wiring insulating layer 120 supports the second inter-wiring insulating layer 220 with the side wall of the recess to form the gap 150 inside the recess. This allows the first inter-wiring insulating layer 120 to have the gap 150 having a specific dielectric constant of 1 around the first wiring layers 130. It is thus possible to reduce the inter-wiring capacitance of the first wiring layers 130.

The first inter-wiring insulating layer 120 may include, for example, a low-dielectric-constant material (so-called low-k material) such as carbon-doped $SiO_2$ or porous silica or an insulating material such as $SiO_2$ or SiOC. It is, however, preferable that the first inter-wiring insulating layer 120 include a low-dielectric-constant material (so-called low-k material) or an insulating material such as $SiO_2$ or SiOC having a low specific dielectric constant to reduce the inter-wiring capacitance of the first wiring layers 130.

Each of the first wiring layers 130 is a wiring line that electrically couples the respective elements included in the semiconductor device 1. The plurality of first wiring layers 130 is provided to be embedded in the first inter-wiring insulating layer 120. Specifically, the first wiring layers 130 are provided in any layout inside a recess formed in the first inter-wiring insulating layer 120. The first wiring layers 130 are provided to project from the bottom surface of the recess formed in the first inter-wiring insulating layer 120. The gap 150 is provided around the first wiring layers 130. The gap 150 is formed by the recess of the first inter-wiring insulating layer 120 and the second inter-wiring insulating layer 220. This makes it possible to provide the gap 150 having a specific dielectric constant of 1 between the wiring lines of the first wiring layers 130. It is thus possible to reduce the inter-wiring capacitance of the first wiring layers 130.

The first wiring layers 130 are provided to be embedded in the first inter-wiring insulating layer 120. The height of each of the first wiring layers 130 is thus less than or equal to the height of the first inter-wiring insulating layer 120. This may cause the gap 150 to be provided on a portion of the first wiring layers 130 between the first wiring layer 130 and the inter-layer insulating film 212 provided on the surface of the second inter-wiring insulating layer 220. In such a case, it is possible to further reduce the inter-wiring capacitance of the first wiring layers 130. In contrast, in a case where the more first wiring layers 130 are in contact with the inter-layer insulating film 212 on the surface of the second inter-wiring insulating layer 220, it is possible to further increase the mechanical strength of the entire semiconductor device 1.

The first wiring layers 130 each include an electrically conductive material. For example, the first wiring layer 130 may include copper (Cu), aluminum (Al), ruthenium (Ru), or cobalt (Co). Alternatively, the first wiring layer 130 may include an alloy (e.g., Cu—Mn alloy, Al—Cu alloy, or the like) of these metals. For example, in a case where the first wiring layer 130 includes copper (Cu) or copper alloy, the first wiring layer 130 is easy to form to be embedded in the first inter-wiring insulating layer 120 by using a damascene method.

The barrier layer 131 includes metal having a high barrier property with respect to an atom. The barrier layer 131 is provided on a surface of the first wiring layer 130 other than the upper surface (i.e., surface on the side opposed to the second inter-wiring insulating layer). More specifically, the barrier layer 131 is provided on a surface on which the first wiring layer 130 is in contact with the first inter-wiring insulating layer 120 in the manufacturing step. The barrier layer 131 prevents an electrically conductive material included in the first wiring layer 130 from being diffused to the first inter-wiring insulating layer 120. The barrier layer 131 may include, for example, tantalum (Ta), titanium (Ti), manganese (Mn), ruthenium (Ru), or cobalt (Co). Alternatively, the barrier layer 131 may include nitrides or oxides of these metals. It is preferable that the barrier layer 131 include a metal material that does not react to materials included in the first wiring layer 130 and the first inter-wiring insulating layer 120 and has a high adhesion property with respect to these materials.

The cap layer 132 includes a material having low permeability with respect to moisture, oxygen, or the like. The cap layer 132 is provided on the first wiring layer 130 and the first inter-wiring insulating layer 120. Specifically, the cap layers 132 are provided on the upper surface of the first wiring layer 130 in contact with the second inter-wiring insulating layer 220 with the inter-layer insulating film 212 interposed therebetween and the upper surface of the side wall of the recess in the first inter-wiring insulating layer 120. That is, the cap layer 132 may be each provided in a region in which the first wiring layer 130 or the first inter-wiring insulating layer 120 is in contact with the second inter-wiring insulating layer 220 with the inter-layer insulating film 212 interposed therebetween. The cap layer 132 makes it possible to prevent the first wiring layer 130 and the first inter-wiring insulating layer 120 from being oxidized by moisture, oxygen, or the like in the manufacturing step to decrease the characteristics, the reliability, and the adhesion property.

The cap layer 132 may include, for example, $SiO_2$, SiC, SiCN, SiOC, SiON, AlN, or the like as a single-layer film or a stacked film. The cap layer 132 may include the same material as that of the sealing film 140 described below or a different material from that of the sealing film 140.

The sealing film 140 includes a material having low permeability with respect to moisture, oxygen, or the like. The sealing film 140 is provided along the uneven shape of the first wiring layer 130 and the first inter-wiring insulating layer 120. Specifically, the sealing film 140 is provided on the internal surface of the recess in the first inter-wiring insulating layer 120, the surfaces of the first wiring layers 130 provided inside the recess, and the upper surfaces of the cap layers 132. The sealing film 140 makes it possible to prevent each of the first wiring layers 130 from being oxidized by the moisture, oxygen, or the like remaining in the gap 150 to increase the electric resistance of the first wiring layer 130 or decrease the reliability of the first wiring layer 130. The sealing film 140 may include, for example, SiO$_2$, SiC, SiCN, SiOC, SiON, AlN, or the like as a single-layer film or a stacked film.

The gaps 150 are provided in the spaces formed by the uneven shape of the first inter-wiring insulating layer 120 and the first wiring layers 130 and the planarized surface of the second inter-wiring insulating layer 220. For example, the inside of each of the gaps 150 may be evacuated of air, include an atmosphere, or encapsulate inert gas such as nitrogen.

The second inter-wiring insulating layer 220 includes an insulating material and is provided above the first inter-wiring insulating layer 120 with the cap layer 132, the sealing film 140, and the inter-layer insulating film 212 interposed therebetween. Specifically, the second inter-wiring insulating layer 220 has the planarized surface that is opposed to the recess in the first inter-wiring insulating layer 120. The second inter-wiring insulating layer 220 is stacked above the first inter-wiring insulating layer 120 in a layered manner to form the gap 150 between the second inter-wiring insulating layer 220 and the recess in the first inter-wiring insulating layer 120. That is, the second inter-wiring insulating layer 220 is planarized above the upper surface of the side wall of the recess in the first inter-wiring insulating layer 120 to serve as a lid on the recess. This allows the second inter-wiring insulating layer 220 to form the gap 150 having a specific dielectric constant of 1 inside the recess in the first inter-wiring insulating layer 120. Here, the planarized surface of the second inter-wiring insulating layer 220 may mean that the corresponding surface of the second inter-wiring insulating layer 220 is not provided with any recess, projection, or structure.

The second inter-wiring insulating layer 220 may include, for example, a low-dielectric-constant material (so-called low-k material) such as carbon-doped SiO$_2$ or porous silica or an insulating material such as SiO$_2$ or SiOC. It is, however, preferable that, in a case where there are provided wiring layers inside the second inter-wiring insulating layer 220, the second inter-wiring insulating layer 220 include a low-dielectric-constant material (so-called low-k material) or an insulating material such as SiO$_2$ or SiOC having a low specific dielectric constant to reduce the inter-wiring capacitance of the wiring layers. It is to be noted that the second inter-wiring insulating layer 220 may be formed by using the same material as that of the first inter-wiring insulating layer 120 or a different material.

The inter-layer insulating films 211 and 212 each include an insulating material and are provided on both principal surfaces of the second inter-wiring insulating layer 220. The inter-layer insulating films 211 and 212 each attain, for example, a function of increasing the junction strength between the second inter-wiring insulating layer 220 and another layer (e.g., sealing film 140), a stopper function for an etching process on a member in an upper layer or a lower layer, or the like. It is to be noted that both or one of the inter-layer insulating films 211 and 212 does not have to be provided in some cases.

The inter-layer insulating films 211 and 212 may each include, for example, a low-dielectric-constant material (so-called low-k material) such as carbon-doped SiO$_2$ or porous silica or an insulating material such as SiO$_2$, SiCN, SiN, SiOC, or SiOCN. In a case where the inter-layer insulating films 211 and 212 are each formed by using a low-dielectric-constant material (so-called low-k material), the inter-layer insulating films 211 and 212 make it possible to further reduce the parasitic capacitance of the semiconductor device 1. In addition, in a case where the inter-layer insulating films 211 and 212 are each formed by using a silicon oxide film or a silicon nitride film (e.g., SiO$_2$, SiCN, SiN, SiOC, SiOCN, or the like), the inter-layer insulating films 211 and 212 make it possible to further increase the junction strength between the first inter-wiring insulating layer 120 and the second inter-wiring insulating layer 220. The inter-layer insulating films 211 and 212 may be each formed by using the same material or a different material. In addition, the inter-layer insulating films 211 and 212 may be each formed by using the same material as that of the inter-layer insulating film 110, the second inter-wiring insulating layer 220, or the first inter-wiring insulating layer 120 or a different material.

Such a structure allows the semiconductor device 1 to have the gaps 150 inside the recess in the first inter-wiring insulating layer 120 by stacking the uneven surface of the first inter-wiring insulating layer 120 and the planarized surface of the second inter-wiring insulating layer 220. In the semiconductor device 1, the first wiring layers 130 are thus formed in the gaps 150 provided in the recess in the first inter-wiring insulating layer 120. This allows the semiconductor device 1 to have the gaps 150 each having a specific dielectric constant of 1 around the first wiring layers 130 even in a case where the first wiring layers 130 are formed in any layout. It is thus possible to reduce the inter-wiring capacitance of the first wiring layers 130.

In addition, it is possible in the semiconductor device 1 to form the sealing film 140 on the first wiring layers 130 along the uneven shape of the first wiring layers 130. This allows the semiconductor device 1 to prevent the first wiring layers 130 from being exposed to the gaps 150 and prevent the first wiring layers 130 from being oxidized by the oxygen or the moisture that may be included in the gaps 150. This allows the semiconductor device 1 to prevent each of the first wiring layers 130 from having increased electric resistance due to oxidization and prevent the adhesion property from decreasing between the first wiring layer 130 and the first inter-wiring insulating layer 120.

It is to be noted that, in a case where the substrate 100 is a semiconductor substrate, the first wiring layers 130 may be electrically coupled to various elements such as transistors formed on the substrate 100 via through vias formed in the inter-layer insulating film 110. The structure of such a semiconductor device 1A is described with reference to FIG. 2. FIG. 2 is a vertical cross-sectional view schematically illustrating a structure example of the semiconductor device 1A in a case where a through via 160 is formed in the inter-layer insulating film 110.

As illustrated in FIG. 2, the through via 160 is provided to reach the substrate 100 from under the first wiring layer 130 through the first inter-wiring insulating layer 120 and the inter-layer insulating film 110. This allows the through via 160 to electrically couple each of the various elements provided on the substrate 100 and the first wiring layer 130. It is sufficient if the through vias 160 are provided as appropriate on the basis of the disposition of the various elements provided on the substrate 100 and the first wiring layers 130. The number and disposition of through vias 160 are not particularly limited. The through vias 160 each include an electrically conductive material. For example, the through via 160 may include copper (Cu), aluminum (Al), tungsten (W), tantalum (Ta), titanium (Ti), ruthenium (Ru), or cobalt (Co). Alternatively, the through via 160 may include an alloy of these metals.

Needless to say, although not illustrated in any of the semiconductor devices 1 illustrated in the diagrams other than FIG. 2, each of the semiconductor devices 1 illustrated in these diagrams may also be provided with the through vias 160 that electrically couple various elements provided on the substrate 100 and the first wiring layers 130.

1.2. Example of Method of Manufacturing Semiconductor Device

Next, an example of the method of manufacturing the semiconductor device 1 according to the present embodiment is described with reference to FIGS. 3, 4A, 4B, 4C, and 4D.

First, an overview of the method of manufacturing the semiconductor device 1 according to the present embodiment is described with reference to FIG. 3. FIG. 3 is a schematic vertical cross-sectional view describing the overview of the method of manufacturing the semiconductor device 1 according to the present embodiment.

As illustrated in FIG. 3, it is possible to form the semiconductor device 1 by bonding a plurality of substrates together. Specifically, the substrate 100 and an opposed substrate 200 are first prepared. The substrate 100 is provided with the inter-layer insulating film 110, the first inter-wiring insulating layer 120, the first wiring layers 130, the barrier layers 131, the cap layers 132, and the sealing film 140. The opposed substrate 200 is provided with the second inter-wiring insulating layer 220 and the inter-layer insulating films 211 and 212. Next, the substrate 100 and the opposed substrate 200 are bonded together to make the first inter-wiring insulating layer 120 and the first wiring layers 130 opposed to the second inter-wiring insulating layer 220. This makes it possible to form the semiconductor device 1.

In this case, a recess is formed on the bonding surface of the first inter-wiring insulating layer 120 of the substrate 100 and the bonding surface of the second inter-wiring insulating layer 220 of the opposed substrate 200 is planarized. This allows the semiconductor device 1 to form the gaps 150 on the bonding surface of the first inter-wiring insulating layer 120 and the second inter-wiring insulating layer 220.

Next, the details of the method of manufacturing the semiconductor device 1 according to the present embodiment are described with reference to FIGS. 4A, 4B, 4C, and 4D. FIGS. 4A, 4B, 4C, and 4D are schematic vertical cross-sectional views describing the respective steps of the method of manufacturing the semiconductor device 1 according to the present embodiment.

First, as illustrated in FIG. 4A, after the inter-layer insulating film 110 and the first inter-wiring insulating layer 120 are formed on the substrate 100, the first wiring layers 130 embedded in the first inter-wiring insulating layer 120 are formed by using a damascene method and the cap layers 132 are formed.

Specifically, CVD (Chemical Vapor Deposition) or the like is used to form the inter-layer insulating film 110 and the first inter-wiring insulating layer 120 on the substrate 100 in order. The substrate 100 may be, for example, a silicon substrate. The inter-layer insulating film 110 may be formed by using, for example, $SiO_2$. The first inter-wiring insulating layer 120 may be formed by using a low-dielectric-constant material (so-called low-k material).

Next, lithography or the like is used to form an opening in the first inter-wiring insulating layer 120. The barrier layer 131 is formed inside the opening and a film of an electrically conductive material such as copper (Cu) is then formed to fill the opening. Afterward, the electrically conductive material such as copper (Cu) formed on the first inter-wiring insulating layer 120 other than the opening is removed by CMP (Chemical Mechanical Polish), full-surface etch-back, or the like and planarized to form the first wiring layer 130. Subsequently, the cap layer 132 is formed on the planarized first inter-wiring insulating layer 120 and first wiring layers 130. The barrier layers 131 may be each formed by using, for example, tantalum nitride (TaN), titanium nitride (TiN), or the like. In addition, the cap layer 132 may be formed by using the above-described material.

Next, as illustrated in FIG. 4B, a patterned mask layer 151 is formed on the cap layer 132.

Specifically, lithography or the like is used to form the mask layer 151 patterned to cover the region not provided with the gap 150 (i.e., to have an opening in the region in which the gap 150 is provided). The mask layer 151 may be, for example, a photoresist or the like. Alternatively, the mask layer 151 may be a stack of a hard mask such as an oxide film or a nitride film and a photoresist.

It is to be noted that the mask layer 151 may be provided in the regions on the first inter-wiring insulating layer 120 or provided in the regions on the first wiring layers 130. The region between the regions in which the mask layer 151 is provided on the first inter-wiring insulating layer 120 serves as a region in which a recess is formed in the first inter-wiring insulating layer 120. In addition, through vias that electrically couple wiring lines formed in the second inter-wiring insulating layer 220 and the first wiring layers 130 are formed in a subsequent step in the regions in which the mask layer 151 is provided on the first wiring layers 130.

Next, as illustrated in FIG. 4C, after the first inter-wiring insulating layer 120 around the first wiring layer 130 is selectively removed to form a recess 153 in the first inter-wiring insulating layer 120, the sealing film 140 is formed on the first wiring layer 130 and the first inter-wiring insulating layer 120.

Specifically, etching is performed by using the mask layer 151 illustrated in FIG. 4B to remove the first inter-wiring insulating layer 120 and the first wiring layer 130 in the region that is not covered with the mask layer 151 and a recess is formed in the first inter-wiring insulating layer 120. In this case, etching is performed to cause the first inter-wiring insulating layer 120 to have a higher etching rate than the etching rate of each of the first wiring layers 130. This makes it possible to selectively remove the first inter-wiring insulating layer 120 around the first wiring layer 130. The recess formed in the first inter-wiring insulating layer 120 may have, for example, a depth of 30 nm to 400 nm. In addition, a step of removing the whole or a portion of the cap layer 132 may be performed afterward.

Next, the sealing film 140 is conformally formed on the first wiring layers 130 and the first inter-wiring insulating layer 120 along the uneven shape of the first wiring layers 130 and the first inter-wiring insulating layer 120. It is possible to perform such conformal film formation by using, for example, CVD, ALD (Atomic Layer Deposition), p-CVD (plasma CVD), or the like.

Next, as illustrated in FIG. 4D, the opposed substrate 200 on which the inter-layer insulating film 211, the second inter-wiring insulating layer 220, and the inter-layer insulating film 212 are stacked is bonded to the first wiring layer 130 and the first inter-wiring insulating layer 120 to form the gap 150 around the first wiring layer 130.

Specifically, CVD or the like is first used to stack the inter-layer insulating film 211, the second inter-wiring insulating layer 220, and the inter-layer insulating film 212 on the opposed substrate 200 in order. The opposed substrate 200 may be, for example, a silicon substrate. The second inter-wiring insulating layer 220 may be formed by using a low-dielectric-constant material (so-called low-k material) and the inter-layer insulating films 211 and 212 may be formed by using, for example, $SiO_2$.

Next, the substrate 100 and the opposed substrate 200 are bonded together to cause the first inter-wiring insulating layer 120 in which the recess is formed to be opposed to the second inter-wiring insulating layer 220 having a planarized principal surface. This makes it possible to form the gaps 150 between the first inter-wiring insulating layer 120 and the second inter-wiring insulating layer 220.

It is to be noted that the bonding surface of the substrate 100 or the opposed substrate 200 may be irradiated with plasma or have moisture injected thereon, for example, before the step of bonding the substrate 100 and the opposed substrate 200 together. This activates the sealing film 140 and the inter-layer insulating film 212 to allow the junction strength to increase. The sealing film 140 and the inter-layer insulating film 212 serve as the junction surface of the substrate 100 and the opposed substrate 200. In addition, the step of bonding the substrate 100 and the opposed substrate 200 together may be performed in a vacuum. This allows the gaps 150 to each have less oxygen or moisture left therein. It is therefore possible to further suppress the first wiring layer 130 being oxidized. Further, after the step of bonding the substrate 100 and the opposed substrate 200 together, a heat treatment step may be performed. This allow the junction strength of the sealing film 140 and the inter-layer insulating film 212 to further increase. The sealing film 140 and the inter-layer insulating film 212 serve as the junction surface of the substrate 100 and the opposed substrate 200.

After the step illustrated in FIG. 4D, the opposed substrate 200 is peeled off from the inter-layer insulating film 211. This allows the semiconductor device 1 illustrated in FIG. 1 to be formed. Specifically, it is possible to remove or peel off the opposed substrate 200 from the inter-layer insulating film 211 by using full-surface etching, a back grinder, or the like.

The above-described manufacturing method makes it possible to bond the opposed substrate 200 and the substrate 100 together without taking the alignment with the first wiring layers 130 into consideration because the second inter-wiring insulating layer 220 or the inter-layer insulating film 212 is planarized and insulated. The second inter-wiring insulating layer 220 or the inter-layer insulating film 212 is the bonding surface of the opposed substrate 200. Such a manufacturing method thus makes it possible to manufacture the semiconductor device 1 with higher productivity.

1.3. Modification Examples of Semiconductor Device

Next, modification examples of the semiconductor device 1 according to the present embodiment are described with reference to FIGS. 5A, 5B, and 5C. FIGS. 5A, 5B, and 5C are vertical cross-sectional views schematically illustrating structure examples of semiconductor devices according to first to third modification examples, respectively.

First Modification Example

As illustrated in FIG. 5A, a semiconductor device 2A according to the first modification example is different from the semiconductor device 1 in that there is provided a second wiring layer 230 inside the second inter-wiring insulating layer 220 and the second wiring layer 230 and the first wiring layer 130 are electrically coupled by a through via 235. The semiconductor device 2A according to the first modification example allows wiring lines to run in more layers.

Specifically, the second wiring layers 230 are each provided to be embedded in the surface side opposed to the surface of the second inter-wiring insulating layer 220 that is opposed to the recess of the first inter-wiring insulating layer 120. The second wiring layers 230 are not particularly limited, but formable in any layout. The second wiring layers 230 each include an electrically conductive material. For example, the second wiring layer 230 may include copper (Cu), aluminum (Al), ruthenium (Ru), or cobalt (Co). Alternatively, the second wiring layer 230 may include an alloy (e.g., Cu—Mn alloy, Al—Cu alloy, or the like) of these metals. For example, in a case where the second wiring layer 230 includes copper (Cu) or copper alloy, it is possible to easily form the second wiring layer 230 to cause the second wiring layer 230 to be embedded in the second inter-wiring insulating layer 220 by using a damascene method.

A barrier layer 231 includes metal having a high barrier property with respect to an atom. The barrier layer 231 is provided on the surface of the second wiring layer 230 on which the second wiring layer 230 and the second inter-wiring insulating layer 220 are in contact. A cap layer 232 includes a material having low permeability with respect to moisture, oxygen, or the like. The cap layer 232 is provided on the second wiring layer 230 and the second inter-wiring insulating layer 220. The functions and materials of the barrier layer 231 and the cap layer 232 are substantially similar to those of the barrier layer 131 and the cap layer 132 and are not thus described here.

The through via 235 is provided to reach the first wiring layer 130 from under the second wiring layer 230 through the second inter-wiring insulating layer 220, the inter-layer insulating film 212, the sealing film 140, and the cap layer 132. This allows the through via 235 to electrically couple the first wiring layer 130 and the second wiring layer 230. The through via 235 is provided in the region in which the first wiring layer 130 is in contact with the second inter-wiring insulating layer 220 with the inter-layer insulating film 212, the sealing film 140, and the cap layer 132 interposed therebetween. In the region in which the first wiring layer 130 is in contact with the second inter-wiring insulating layer 220, the gap 150 is not formed between the first wiring layer 130 and the second inter-wiring insulating layer 220. This makes it possible to form the through via 235 more easily.

It is to be noted that each of the other components is substantially similar to the component of the semiconductor device 1 described with reference to FIG. 1 and therefore is not described here.

The semiconductor device 2A like this allows wiring lines to run in more layers.

Second Modification Example

As illustrated in FIG. 5B, a semiconductor device 2B according to the second modification example is different from the semiconductor device 2A in that the first inter-wiring insulating layer 120 having the first wiring layers 130 and the gaps 150 formed inside the recess is further formed again. The semiconductor device 2B according to the second modification example makes it possible to reduce the inter-wiring capacitance of the respective wiring lines formed in a plurality of layers.

Specifically, a third inter-wiring insulating layer 320 is provided above the first inter-wiring insulating layer 120 with an inter-layer insulating film 312 interposed therebetween. The gaps 150 are formed by the planarized surface of the third inter-wiring insulating layer 320 and the recess in the first inter-wiring insulating layer 120. In addition, the third inter-wiring insulating layer 320 is provided with third wiring layers 330, barrier layers 331, cap layers 332, and a sealing film 340. These components form gaps 350 as with the first inter-wiring insulating layer 120. In the semiconductor device 2B illustrated in FIG. 5B, the first wiring layers 130 and the third wiring layers 330 have the same layout, but the first wiring layers 130 and the third wiring layers 330 may be independently laid out.

The third wiring layer 330 is electrically coupled to the first wiring layer 130 by a through via 325 provided by penetrating the third inter-wiring insulating layer 320, the inter-layer insulating film 312, the sealing film 140, and the cap layer 132 from under the third wiring layer 330. The third wiring layer 330 is electrically coupled to the second wiring layer 230 by a through via 225 provided by penetrating the second inter-wiring insulating layer 220, the inter-layer insulating film 212, the sealing film 340, and the cap layer 332 from under the second wiring layer 230. This makes it possible to electrically couple the first wiring layers 130 and the third wiring layers 330 provided with the gaps 150 and 350 between the wiring lines and the second wiring layer 230 to each other.

It is to be noted that the respective components of the third inter-wiring insulating layer 320, the third wiring layer 330, the barrier layer 331, the cap layer 332, the sealing film 340, and a through via 335 are substantially similar to those of the first inter-wiring insulating layer 120, the first wiring layer 130, the barrier layer 131, the cap layer 132, the sealing film 140, and the through via 235 and are not thus described here.

The semiconductor device 2B like this makes it possible to reduce the inter-wiring capacitance of the respective wiring lines formed in a plurality of layers.

Third Modification Example

As illustrated in FIG. 5C, a semiconductor device 2C according to the third modification example is different from the semiconductor device 2B in that a fifth inter-wiring insulating layer 520, a fifth wiring layer 530, a fourth inter-wiring insulating layer 420, a fourth wiring layer 430, and the like are formed and a semiconductor substrate 500 is further bonded on which a circuit having a predetermined function. The semiconductor device 2C according to the third modification example makes it possible to reduce the inter-wiring capacitance in a stacked semiconductor device in which substrates on which circuits having different functions are formed are stacked. For example, the substrate 100 may be provided with a pixel circuit in which a plurality of pixels is arranged and the semiconductor substrate 500 may be provided with a logic circuit that performs information processing on pixel signals subjected to photoelectric conversion by a pixel unit.

On the semiconductor substrate 500, various elements such as transistors are formed. The semiconductor substrate 500 may be formed by using Si, Ge, GaAs, GaN, SiC, or the like.

The semiconductor substrate 500 may have any stacked structure. For example, the fifth inter-wiring insulating layer 520 may be provided above the semiconductor substrate 500 with an inter-layer insulating film 511 interposed therebetween. The fifth wiring layers 530 may be provided to be embedded in the fifth inter-wiring insulating layer 520. There may be provided a fourth inter-wiring insulating layer 410 above the fifth wiring layers 530 and the fifth inter-wiring insulating layer 520 with a cap layer 513 interposed therebetween. The fourth wiring layers 430 may be provided embedded in the fourth inter-wiring insulating layer 410. In this case, the contact surfaces between the fifth wiring layers 530 and the fifth inter-wiring insulating layer 520 and the contact surfaces between the fourth wiring layers 430 and the fourth inter-wiring insulating layer 420 may be provided with barrier layers 531 and 431, respectively.

Here, the fourth wiring layers 430 are each provided to be exposed on the surface of the fourth inter-wiring insulating layer 420 and the second wiring layers 230 are each similarly provided to be exposed on the surface of the second inter-wiring insulating layer 220. This allows the second wiring layer 230 and the fourth wiring layer 430 to form electrical coupling by joining the electrically conductive materials (e.g., copper or copper alloy) exposed on the surfaces to each other by heat treatment or the like. This allows the second wiring layer 230 and the fourth wiring layer 430 to be electrically coupled even without forming any through via or the like between the second wiring layer 230 and the fourth wiring layer 430. It is thus possible to further simplify the step of manufacturing the semiconductor device 2C.

It is to be noted that the fourth inter-wiring insulating layer 420 and the fifth inter-wiring insulating layer 520 are substantially similar to the first inter-wiring insulating layer 120. The fourth wiring layers 430 and the fifth wiring layers 530 are substantially similar to the first wiring layers 130. The inter-layer insulating film 511 is substantially similar to the inter-layer insulating film 312. A cap layer 512 is substantially similar to the cap layer 132. The barrier layers 431 and 531 are substantially similar to the barrier layer 131. They are not thus described here.

The semiconductor device 2C like this makes it possible to reduce the inter-wiring capacitance of wiring lines by forming the gaps 150 and 350 in a stacked semiconductor device.

2. Second Embodiment 2.1. First Structure Example of Solid-State Imaging Device

Next, a first structure example of a solid-state imaging device according to a second embodiment of the present disclosure is described with reference to FIGS. 6A, 6B, 7A, and 7B. FIG. 6A is a vertical cross-sectional view schematically illustrating the first structure example of the solid-state imaging device according to the present embodiment. FIG. 6B is an explanatory diagram schematically illustrating a pixel circuit of the solid-state imaging device according to the present embodiment. FIGS. 7A and 7B are planar cross-sectional views each schematically illustrating the planar disposition of the first structure example of the solid-state imaging device according to the present embodiment.

As illustrated in FIG. 6A, a solid-state imaging device 10 includes inter-layer insulating films 710, 737, and 757 and inter-wiring insulating layers 720, 730, 740, 750, and 760 stacked on a semiconductor substrate 700 such as a silicon substrate. The inter-wiring insulating layers 720, 730, 740, and 750 are respectively provided with wiring layers 723, 733, 743, and 753 each including copper, copper alloy, or the like. The wiring layers 723, 733, 743, and 753 are electrically coupled, for example, by through vias 732, 742, and 752 that respectively penetrate the inter-wiring insulating layers 730, 740, and 750. It is to be noted that the contact surfaces between the wiring layers 723, 733, 743, and 753 and the inter-wiring insulating layers 720, 730, 740, and 750 may be provided with barrier layers 721, 731, 741, and 751. The upper surfaces of the wiring layers 733 and 753 may be provided with cap layers 736 and 756.

In the semiconductor substrate 700, a photodiode (not illustrated), a power supply (not illustrated), a floating diffusion 711, and the like are formed. On the semiconductor substrate 700, a plurality of transistors 712 is formed that includes a transfer transistor, a reset transistor, an amplifying transistor, a selection transistor, and the like. That is, the semiconductor substrate 700 is provided with the pixel unit of the solid-state imaging device 10. The pixel unit of the solid-state imaging device 10 may include, for example, the pixel circuit illustrated in FIG. 6B.

Specifically, as illustrated in FIG. 6B, the solid-state imaging device 10 according to the present embodiment includes an imaging unit 13 (so-called pixel unit) and peripheral circuits. In the imaging unit 13 (so-called pixel unit), a plurality of pixels 12 is regularly arranged two-dimensionally. The peripheral circuits include a vertical driving unit 14, a horizontal transfer unit 15, and an output unit 16. The peripheral circuits are disposed around the imaging unit 13. The pixels 12 may each include one photodiode PD, one floating diffusion FD, and four transistors: a transfer transistor Tr1; a reset transistor Tr2; an amplifying transistor Tr3; and a selection transistor Tr4. It is to be noted that the floating diffusion FD and the four transistors of the transfer transistor Tr1, the reset transistor Tr2, the amplifying transistor Tr3, and the selection transistor Tr4 do not necessarily have to be provided on the same substrate as that of the photodiode PD. For example, the floating diffusion FD and all or a portion of the four transistors may be provided on a substrate different from the substrate provided with the photodiode PD.

The photodiode PD is a photoelectric conversion element that generates signal charges by photoelectrically converting incident light. The transfer transistor Tr1 is a transistor that reads out the signal charges accumulated in the photodiode PD into the floating diffusion FD described below. The floating diffusion FD is a region that is provided between the transfer transistor Tr1 and the reset transistor Tr2 and accumulates signal charges. The reset transistor Tr2 is a transistor for setting the electric potential of the floating diffusion FD at a predefined value. The amplifying transistor Tr3 is a transistor for electrically amplifying the signal charges read out into the floating diffusion FD. The selection transistor Tr4 is a transistor for reading out amplified pixel signals into a vertical signal line 18 by selecting one row of the pixel unit of the solid-state imaging device 10. It is to be noted that the selection transistor does not have to be provided depending on the configuration of the pixel 12 thought not illustrated.

These components are electrically coupled to each other, thereby forming the circuits of the pixel 12. Specifically, the source of the transfer transistor Tr1 is coupled to the photodiode PD and the drain of the transfer transistor Tr1 is coupled to the source of the reset transistor Tr2. The floating diffusion FD (corresponding to the drain region of the transfer transistor Tr1 and the source region of the reset transistor Tr2) between the transfer transistor Tr1 and the reset transistor Tr2 is coupled to the gate of the amplifying transistor Tr3. The source of the amplifying transistor Tr3 is coupled to the drain of the selection transistor Tr4. The drain of the reset transistor Tr2 and the drain of the amplifying transistor Tr3 are coupled to the power supply. In addition, the source of the selection transistor Tr4 is coupled to the vertical signal line 18.

In addition, these components output pixel signals from the pixel 12 in the operations as described below. Specifically, first, the charges of the photodiode PD are all emptied by turning on the gate of the transfer transistor Tr1 and the gate of the reset transistor Tr2. Next, charges are accumulated by turning off the gate of the transfer transistor Tr1 and the gate of the reset transistor Tr2. Subsequently, the electric potential of the floating diffusion FD is reset by turning on the gate of the reset transistor Tr2 immediately before the charges of the photodiode PD are read out. Afterward, the charges are transferred from the photodiode PD to the floating diffusion FD by turning off the gate of the reset transistor Tr2 and turning on the gate of the transfer transistor Tr1. The amplifying transistor Tr3 electrically amplifies signal charges in response to the application of the charges to the gate. Meanwhile, the selection transistor Tr4 reads image signals subjected to charge-voltage conversion by the amplifying transistor Tr3 into the vertical signal line 18 by turning on only a pixel to be read when the floating diffusion FD is reset.

The vertical driving unit 14 supplies a row reset signal φRST applied in common to the gates of the reset transistors Tr2 of pixels arranged in one row. In addition, the vertical driving unit 14 similarly supplies a row transfer signal φTRG applied in common to the gates of the transfer transistors Tr1 of the pixels in one row. Further, the vertical driving unit 14 similarly supplies a row selection signal φSEL applied in common to the gates of the selection transistors Tr4 in one row.

The horizontal transfer unit 15 includes, for example, an analog/digital converter 19 coupled to the vertical signal line 18 of each column, a column selection circuit SW (e.g., switch), and a horizontal transfer line 20 (e.g., bus wiring line including the same number of wiring lines as the number of data bit lines). The output unit 16 includes, for example, a signal processing circuit 21 that processes an output from the horizontal transfer line 20 and an output buffer 22.

In the solid-state imaging device 10 like this, the signals of the pixels 12 in the respective rows are subjected to analog/digital conversion by the respective analog/digital converters 19, read out through the sequentially selected column selection circuits SW into the horizontal transfer lines 20, and subsequentially transferred horizontally. The image data read out into the horizontal transfer line 20 is outputted from the output buffer 22 through the signal processing circuit 21.

Description is given with reference to FIG. 6A again. The wiring layer 723 is provided inside the recess in the inter-wiring insulating layer 720. There is provided a gap 725 around the wiring layer 723. The gap 725 is formed by the recess in the inter-wiring insulating layer 720 and the inter-layer insulating film 737. In addition, the wiring layer 743 is provided inside the recess in the inter-wiring insulating layer 740. There is provided a gap 745 around the wiring layer 743. The gap 745 is formed by the recess in the inter-wiring insulating layer 740 and the inter-layer insulating film 757. This allows the solid-state imaging device 10 to further reduce the inter-wiring capacitance of the wiring layers 723 and 743.

The wiring layers 723 and 743 whose inter-wiring capacitance is reduced may be, for example, FD (floating diffusion)

wiring lines or vertical signal lines. Such a configuration is described with reference to FIGS. 7A and 7B.

As illustrated in FIG. 7A, the wiring layer 743 is a vertical signal line. The wiring layer 743 may be a wiring line that extends and couples the respective pixels arranged in a matrix in one direction (e.g., column direction). In this case, the gap 745 may be provided in the region between the through vias 752 that are each coupled to the wiring layer 743. The solid-state imaging device 10 uses the gap 745 to reduce the inter-wiring capacitance of the wiring layers 743, thereby allowing the transmission speed of analog signals to increase.

As illustrated in FIG. 7B, the wiring layer 723 is an FD wiring line. The wiring layer 723 may be a wiring line for a path through which signal charges subjected to photoelectric conversion by a photodiode are transmitted to the plurality of transistors 712. In this case, the gap 725 may be provided in a region other than the region around the through via 732 that is coupled to the wiring layer 723. The solid-state imaging device 10 uses the gap 725 to reduce the inter-wiring capacitance of the wiring layers 723, thereby making it possible to further increase the conversion efficiency of converting signal charges to pixel signals. The wiring layers 723 are provided in complicated layout depending on the layout of the photodiodes of the respective pixels and various transistors. Accordingly, the use of the technology according to the present disclosure that makes it possible to form a gap even between wiring lines in any layout allows the gap 725 to be more certainly provided between the wiring lines of the wiring layers 723.

2.2. Second Structure Example of Solid-State Imaging Device

Next, a second structure example of the solid-state imaging device according to the present embodiment is described with reference to FIG. 8. FIG. 8 is a vertical cross-sectional view schematically illustrating the second structure example of the solid-state imaging device according to the present embodiment.

In the solid-state imaging device, PD (photodiode) 20019 receives incident light 20001 coming from the back surface (upper surface in the diagram) side of a semiconductor substrate 20018. Above the PD 20019, a planarization film 20013, CF (color filter) 20012, and a microlens 20011 are provided. The incident light 20001 sequentially passing through the respective units is received by a light reception surface 20017 and is subjected to photoelectric conversion.

For example, in the PD 20019, an n-type semiconductor region 20020 is formed as a charge accumulation region that accumulates charges (electrons). In the PD 20019, the n-type semiconductor region 20020 is provided inside p-type semiconductor regions 20016 and 20041 of the semiconductor substrate 20018. The n-type semiconductor region 20020 is provided with the p-type semiconductor region 20041 on the front surface (lower surface) side of the semiconductor substrate 20018. The p-type semiconductor region 20041 has higher impurity concentration than that of the back surface (upper surface) side. That is, the PD 20019 has an HAD (Hole-Accumulation Diode) structure. The p-type semiconductor regions 20016 and 20041 are formed to suppress the generation of dark currents at the respective interfaces with the upper surface side and lower surface side of the n-type semiconductor region 20020.

A pixel separation unit 20030 that electrically separates a plurality of pixels 20010 from each other is provided inside the semiconductor substrate 20018 and the PD 20019 is provided in a region defined by this pixel separation unit 20030. In the diagram, in a case where the solid-state imaging device is viewed from the upper surface side, the pixel separation units 20030 are formed in a lattice, for example, to be interposed between the plurality of pixels 20010. The PDs 20019 are each formed in the region defined by this pixel separation unit 20030.

In each PD 20019, the anode is grounded. In the solid-state imaging device, the signal charges (e.g., electrons) accumulated by the PD 20019 are read out via transfer Tr (MOS FET) or the like that is not illustrated and outputted as electric signals to VSL (vertical signal line) that is not illustrated. It is to be noted that there may be provided a pixel circuit including a plurality of Tr and FD as described in the first structure example from the transfer Tr to the VSL.

A wiring layer 20050 is provided on the front surface (lower surface) of the semiconductor substrate 20018 that is opposite to the back surface (upper surface) provided with the respective units such as a light-shielding film 20014, the CF 20012, and the microlens 20011.

The wiring layer 20050 includes a wiring line 20051 and an insulating layer 20052. The wiring line 20051 is formed to be electrically coupled to each element in the insulating layer 20052. The wiring layer 20050 is a so-called multilayer wiring layer and is formed by alternately stacking interlayer insulating films and the wiring lines 20051 a plurality of times. The inter-layer insulating films are included in the insulating layer 20052. Here, as the wiring lines 20051, wiring lines to Tr such as the transfer Tr for reading out charges from the PD 20019 or respective wiring lines such as the VSL are stacked with the insulating layer 20052 interposed therebetween.

The wiring layer 20050 is provided with a support substrate 20061 on the surface opposite to the side on which the PD 20019 is provided. For example, a substrate including a silicon semiconductor and having a thickness of several hundreds of μm is provided as the support substrate 20061.

The light-shielding film 20014 is provided on the back surface (upper surface in the diagram) side of the semiconductor substrate 20018.

The light-shielding film 20014 is configured to block a portion of the incident light 20001 from above the semiconductor substrate 20018 toward the back surface of the semiconductor substrate 20018.

The light-shielding film 20014 is provided above the pixel separation unit 20030 provided inside the semiconductor substrate 20018. Here, the light-shielding film 20014 is provided to protrude on the back surface (upper surface) of the semiconductor substrate 20018 in the shape of a projection with an insulating film 20015 such as a silicon oxide film interposed therebetween. In contrast, to make the incident light 20001 enter the PD 20019, the light-shielding film 20014 is not provided, but there is an opening above the PD 20019 provided inside the semiconductor substrate 20018.

That is, in a case where the solid-state imaging device is viewed from the upper surface side in the diagram, the light-shielding film 20014 has a grid planar shape and an opening through which the incident light 20001 passes to the light reception surface 20017 is formed.

The light-shielding film 20014 includes a light-shielding material that blocks light. For example, titanium (Ti) films and tungsten (W) films are sequentially stacked to form the light-shielding film 20014. In addition, it is possible to form the light-shielding film 20014 by sequentially stacking, for example, titanium nitride (TiN) films and tungsten (W) films.

The light-shielding film 20014 is covered with the planarization film 20013. The planarization film 20013 is formed by using an insulating material that transmits light.

The pixel separation unit 20030 includes a groove 20031, a fixed-charge film 20032, and an insulating film 20033.

The fixed-charge film 20032 is formed on the back surface (upper surface) side of the semiconductor substrate 20018 to cover the groove 20031 that defines the space between the plurality of pixels 20010.

Specifically, the fixed-charge film 20032 is provided to cover the inner surface of the groove 20031 formed on the back surface (upper surface) side of the semiconductor substrate 20018 with a predetermined thickness. The insulating film 20033 is then provided to fill (be loaded into) the inside of the groove 20031 covered with the fixed-charge film 20032.

Here, the fixed-charge film 20032 is formed by using a high dielectric material having a negative fixed charge to form a positive-charge (hole) accumulation region at the interface with the semiconductor substrate 20018 and suppress the generation of dark currents. The fixed-charge film 20032 is formed to have a negative fixed charge. This causes the negative fixed charge to apply an electric field to the interface with the semiconductor substrate 20018 and forms a positive-charge (hole) accumulation region.

It is possible to form the fixed-charge film 20032 by using, for example, a hafnium oxide film ($HfO_2$ film). In addition, it is possible to form the fixed-charge film 20032 to cause the fixed-charge film 20032 to additionally include at least one of oxides of hafnium, zirconium, aluminum, tantalum, titanium, magnesium, yttrium, lanthanide elements, or the like, for example.

Here, the technology according to the present disclosure is applicable to the wiring layer 20050 of the solid-state imaging device as described above.

2.3. Third Structure Example of Solid-State Imaging Device

Next, a third structure example of the solid-state imaging device according to the present embodiment is described with reference to FIG. 9. FIG. 9 is a vertical cross-sectional view schematically illustrating the third structure example of the solid-state imaging device according to the present embodiment.

FIG. 9 illustrates a configuration example of a stacked solid-state imaging device. As illustrated in FIG. 9, a solid-state imaging device 23020 is configured as one semiconductor chip in which the two dies of a sensor die 23021 and a logic die 23024 are stacked and electrically coupled.

In the sensor die 23021, PDs (photodiodes), FDs (floating diffusions), and Trs (MOS FETs) included in pixels serving as a pixel region, Tr serving as a control circuit, and the like are formed. Further, a wiring layer 23101 including a wiring line 23110 with a plurality of layers is formed in the sensor die 23021. In this example, the wiring line 23110 includes three layers. It is to be noted that it is possible to include (Tr serving as) a control circuit in not the sensor die 23021, but the logic die 23024. It is to be noted that there may be provided a pixel circuit including a plurality of Tr and FD as described in the first structure example in the sensor die 23021.

In the logic die 23024, Tr included in a logic circuit is formed. Further, a wiring layer 23161 including a wiring line 23170 with a plurality of layers is formed in the logic die 23024. In this example, the wiring line 23170 includes three layers. In addition, a contact hole 23171 having an insulating film 23172 formed on the inner wall surface thereof is formed in the logic die 23024. The contact hole 23171 is filled with an interconnecting conductor 23173 to be coupled to the wiring line 23170 and the like.

The sensor die 23021 and the logic die 23024 are bonded together with the wiring layers 23101 and 23161 thereof opposed to each other. This forms the stacked solid-state imaging device 23020 in which the sensor die 23021 and the logic die 23024 are stacked.

The solid-state imaging device 23020 is formed by superimposing the sensor die 23021 on the logic die 23024 to bring the wiring lines 23110 and 23170 into direct contact, heating them while applying a desired weight, and directly joining the wiring lines 23110 and 23170. This electrically couples the sensor die 23021 and the logic die 23024 via the wiring layer 23101 and the wiring layer 23161.

The technology according to the present disclosure is applicable to the wiring layers 23101 and 23161 of the solid-state imaging device 23020 as described above.

2.4. Fourth Structure Example of Solid-State Imaging Device

Next, a fourth structure example of the solid-state imaging device according to the present embodiment is described with reference to FIG. 10. FIG. 10 is a vertical cross-sectional view schematically illustrating the fourth structure example of the solid-state imaging device according to the present embodiment.

FIG. 10 illustrates a configuration example of a stacked solid-state imaging device. A solid-state imaging device 23401 has a three-layer stacked structure in which the three dies of a sensor die 23411, a logic die 23412, and a memory die 23413 are stacked. This electrically couples the three dies of the sensor die 23411, the logic die 23412, and the memory die 23413 to configure the solid-state imaging device 23401 as one semiconductor chip.

In FIG. 10, the logic die 23412 and the memory die 23413 are stacked under the sensor die 23411 in this order, but it is possible to stack the logic die 23412 and the memory die 23413 under the sensor die 23411 in the inverse order, that is, in the order of the memory die 23413 and the logic die 23412.

In the logic die 23412, Tr included in a logic circuit is formed.

The memory die 23413 includes a memory circuit that stores, for example, data which is temporarily necessary in signal processing performed in the logic die 23412.

PD serving as a photoelectric conversion section of a pixel and a source/drain region of a pixel Tr are formed in the sensor die 23411. There may be provided a pixel circuit including a plurality of Tr and FD as described in the first structure example in the sensor die 23411.

A gate electrode is formed around PD with a gate insulating film interposed therebetween. The gate electrode and the paired source/drain regions form a pixel Tr 23421 and a pixel Tr 23422.

The pixel Tr 23421 adjacent to the PD is transfer Tr and one of the paired source/drain regions included in the pixel Tr 23421 is FD.

In addition, an inter-layer insulating film is formed in the sensor die 23411 and contact holes are formed in the inter-layer insulating film. Interconnecting conductors 23431 coupled to the pixel Tr 23421 and the pixel Tr 23422 are formed in the contact holes.

Further, a wiring layer 23433 including a multi-layer wiring line 23432 coupled to each of the interconnecting conductors 23431 is formed in the sensor die 23411.

In addition, an aluminum pad 23434 serving as an electrode for external coupling is formed in the lowermost layer of the wiring layer 23433 in the sensor die 23411. That is, the aluminum pad 23434 is formed at a position closer to a joint surface 23440 with the logic die 23412 than the wiring line 23432 in the sensor die 23411. The aluminum pad 23434 is used as an end of a wiring line for inputting and outputting signals to and from the outside.

Further, a contact 23441 is formed in the sensor die 23411. The contact 23441 is used for electrical coupling to the logic die 23412. The contact 23441 is coupled to a contact 23451 in the logic die 23412 and is also coupled to an aluminum pad 23442 in the sensor die 23411.

In the sensor die 23411, a pad hole 23443 is then formed to reach the aluminum pad 23442 from the back surface side (upper side) of the sensor die 23411.

The technology according to the present disclosure is applicable to the wiring layer 23433 of the solid-state imaging device 23401 as described above.

3. Application Examples (Application to Endoscopic Surgery System)

The technology (the present technology) according to the present disclosure is applicable to a variety of products. For example, the technology according to the present disclosure may be applied to an endoscopic surgery system.

FIG. 11 is a view depicting an example of a schematic configuration of an endoscopic surgery system to which the technology according to an embodiment of the present disclosure (present technology) can be applied.

In FIG. 11, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

FIG. 12 is a block diagram depicting an example of a functional configuration of the camera head 11102 and the CCU 11201 depicted in FIG. 11.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

The above has described the example of the endoscopic surgery system to which the technology according to the present disclosure may be applied. The technology according to the present disclosure may be applied, for example, to the image pickup unit 11402 or the like of the camera head 11102 among the above-described components. Specifically, the solid-state imaging device 10 illustrated in FIG. 6A or the like is applicable to the image pickup unit 10402. Applying the technology according to the present disclosure to the image pickup unit 10402 makes it possible to offer a clearer surgical region image with less latency. This allows a surgeon to treat a surgical region as if the surgeon directly observed the surgical region.

It is to be noted that the endoscopic surgery system has been described here as an example, but the technology according to the present disclosure may be additionally applied, for example, to a microscopic surgery system or the like.

Example of Application to Mobile Body

For example, the technology according to the present disclosure may be achieved as a device mounted on any type of mobile body such as an automobile, an electric vehicle, a hybrid electric vehicle, a motorcycle, a bicycle, a personal mobility, an airplane, a drone, a vessel, or a robot.

FIG. 13 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 13, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 13, an audio speaker 12061, a display section 12062, and an instrument panel 12063 are illustrated as the output device. The display section 12062 may, for example, include at least one of an on-board display and a head-up display.

FIG. 14 is a diagram depicting an example of the installation position of the imaging section 12031.

In FIG. 14, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 14 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

The above has described the example of the vehicle control system to which the technology according to the present disclosure may be applied. The technology according to the present disclosure is applicable, for example, to the imaging section 12031 or the like among the above-described components. Specifically, the solid-state imaging device 10 illustrated in FIG. 6A or the like is applicable to the imaging section 12031. Applying the technology according to the present disclosure to the imaging section 12031 makes it possible to offer a clearer shot image. This allows the vehicle control system to have higher image recognition accuracy.

A preferred embodiment(s) of the present disclosure has/have been described above in detail with reference to the accompanying drawings, but the technical scope of the present disclosure is not limited to such an embodiment(s). A person skilled in the art may find various alterations and modifications within the scope of the appended claims, and it should be understood that they will naturally come under the technical scope of the present disclosure.

In addition, the effects described herein are merely illustrative and exemplary, but not limitative. That is, the technology according to the present disclosure may exert other effects that are apparent to those skilled in the art from the description herein in addition to the above-described effects or in place of the above-described effects. It is to be noted that the following configurations also fall within the technical scope of the present disclosure.

(1)

A semiconductor device including:
- a first inter-wiring insulating layer that is provided on a substrate and includes a recess on a side opposite to the substrate;
- a first wiring layer that is provided inside the recess in the first inter-wiring insulating layer;
- a sealing film that is provided along an uneven shape of the first wiring layer and the first inter-wiring insulating layer;
- a second inter-wiring insulating layer that is provided on the first inter-wiring insulating layer to cover the recess, the second inter-wiring insulating layer having a planarized surface that is opposed to the recess; and
- a gap that is provided between the second inter-wiring insulating layer and the first wiring layer and the first inter-wiring insulating layer.

(2)

The semiconductor device according to (1), in which the first wiring layer is provided to project from a bottom surface of the recess.

(3)

The semiconductor device according to (2), in which
- height of a portion of the first wiring layers is lower than height of the first inter-wiring insulating layer, and
- the gap is further provided between the second inter-wiring insulating layer and a portion of the first wiring layers.

(4)

The semiconductor device according to any one of (1) to (3), in which
- a plurality of the first wiring layers is provided inside the recess, and
- the gaps are continuously provided between a plurality of the first wiring layers.

(5)

The semiconductor device according to any one of (1) to (4), in which a junction surface between the first inter-wiring insulating layer and the second inter-wiring insulating layer is provided with the sealing film.

(6)

The semiconductor device according to any one of (1) to (5), in which a surface of the second inter-wiring insulating layer is provided with a silicon oxide film or a silicon nitride film.

(7)

The semiconductor device according to any one of (1) to (6), in which a surface of the first wiring layer in contact with the first inter-wiring insulating layer is provided with a barrier layer including an element of any of titanium, tantalum, ruthenium, or cobalt.

(8)

The semiconductor device according to any one of (1) to (7), in which
- a second wiring layer is further provided on the second inter-wiring insulating layer, and
- a through via provided by penetrating the second inter-wiring insulating layer is further provided in a region in which the second inter-wiring insulating layer and the first wiring layer are in contact, the through via electrically coupling the second wiring layer and the first wiring layer.

(9)

The semiconductor device according to (8), in which
- the second inter-wiring insulating layer includes a recess on a side opposite to the substrate,
- the second wiring layer is provided inside the recess in the second inter-wiring insulating layer,
- a third inter-wiring insulating layer is further provided on the second inter-wiring insulating layer to cover the recess in the second inter-wiring insulating layer, the third inter-wiring insulating layer having a planarized surface that is opposed to the recess, and
- a gap is further provided between the third inter-wiring insulating layer and the second wiring layer and the second inter-wiring insulating layer.

(10)

The semiconductor device according to any one of (1) to (9), further including a stacked substrate including a semiconductor substrate on which a circuit having a predetermined function is formed and a multi-layer wiring layer that is stacked on the semiconductor substrate, in which
- the stacked substrate is bonded to the substrate to have the multi-layer wiring layer opposed to a surface on a side on which the second inter-wiring insulating layer is provided.

(11)

The semiconductor device according to (10), in which the semiconductor substrate or the substrate is provided with a pixel unit in which a plurality of pixels is arranged.

(12)

The semiconductor device according to (11), in which
- the semiconductor substrate is provided with a logic circuit, and
- the substrate is provided with the pixel unit.

(13)

The semiconductor device according to (12), in which the first wiring layer includes a floating diffusion wiring line that accumulates a charge from a photoelectric conversion element corresponding to each of the plurality of pixels.

(14)

The semiconductor device according to (12) or (13), in which the first wiring layer includes a vertical signal line that transmits pixel signals from the plurality of pixels.

(15)

A method of manufacturing a semiconductor device, the method including:

forming a first inter-wiring insulating layer on a substrate, the first inter-wiring insulating layer having a first wiring layer embedded on a side opposite to the substrate;
forming a recess in the first inter-wiring insulating layer and exposing the first wiring layer inside the recess;
providing a sealing film along an uneven shape of the first wiring layer and the first inter-wiring insulating layer; and
providing a second inter-wiring insulating layer on the first inter-wiring insulating layer to cover the recess and forming a gap between the second inter-wiring insulating layer and the first wiring layer and the first inter-wiring insulating layer, the second inter-wiring insulating layer having a planarized surface that is opposed to the recess.

REFERENCE SIGNS LIST 1 semiconductor device
100 substrate
110 inter-layer insulating film
120 first inter-wiring insulating layer
130 first wiring layer
131 barrier layer
132 cap layer
140 sealing film
150 gap
200 opposed substrate
211, 212 inter-layer insulating film
220 second inter-wiring insulating layer
160 through via

The invention claimed is:

1. A semiconductor device, comprising:
a first substrate that includes a first circuit having a first function;
a first inter-wiring insulating layer on the first substrate, wherein the first inter-wiring insulating layer includes a recess on a side opposite to the first substrate;
a second inter-wiring insulating layer on the first inter-wiring insulating layer to cover the recess, wherein the second inter-wiring insulating layer includes a second wiring layer;
a first wiring layer inside the recess in the first inter-wiring insulating layer;
a gap around the first wiring layer, wherein the gap is between the first inter-wiring insulating layer and the second inter-wiring insulating layer;
a second substrate that includes a second circuit having a second function, wherein the second function of the second circuit is different from the first function of the first circuit; and
a multi-layer wiring layer on the second substrate, wherein
the multi-layer wiring layer opposes the second inter-wiring insulating layer,
the multi-layer wiring layer includes:
a fourth inter-wiring insulating layer; and
a fourth wiring layer in the fourth inter-wiring insulating layer, wherein the fourth wiring layer is electrically coupled to the second wiring layer.

2. The semiconductor device according to claim 1, wherein the second wiring layer is electrically coupled to the multi-layer wiring layer.

3. The semiconductor device according to claim 2, wherein the multi-layer wiring layer further includes:

a third inter-wiring insulating layer;
a third wiring layer in the third inter-wiring insulating layer.

4. The semiconductor device according to claim 2, further comprising:
a third inter-wiring insulating layer between the second inter-wiring insulating layer and the first inter-wiring insulating layer, wherein
the third inter-wiring insulating layer has a planarized surface that is opposed to the recess and covers the recess, and
the third inter-wiring insulating layer includes a third wiring layer; and a gap around the third wiring layer.

5. The semiconductor device according to claim 2, further comprising a through via that penetrates through the second inter-wiring insulating layer, wherein the through via is under the second wiring layer and electrically couples the second wiring layer and the first wiring layer.

6. The semiconductor device according to claim 1, further comprising a plurality of first wiring layers inside the recess in the first inter-wiring insulating layer, wherein
the gap is further between the plurality of first wiring layers, and
the plurality of first wiring layers includes the first wiring layer.

7. The semiconductor device according to claim 6, wherein
a height of the first wiring layer of the plurality of first wiring layers is lower than a height of the first inter-wiring insulating layer, and
the gap is further between the second inter-wiring insulating layer and the first wiring layer of the plurality of first wiring layers.

8. The semiconductor device according to claim 1, wherein one of the first circuit or the second circuit corresponds to a pixel circuit that includes a plurality of pixels.

9. The semiconductor device according to claim 8, wherein
the first circuit corresponds to the pixel circuit, and
the second circuit corresponds to a logic circuit.

10. The semiconductor device according to claim 9, wherein the first wiring layer includes a floating diffusion wiring line that accumulates a charge from a photoelectric conversion element corresponding to each of the plurality of pixels.

11. The semiconductor device according to claim 9, wherein the first wiring layer includes a vertical signal line that transmits pixel signals from the plurality of pixels.

12. The semiconductor device according to claim 1, further comprising a sealing film along an uneven shape of the first wiring layer and the first inter-wiring insulating layer, wherein the sealing film is further in a junction surface between the first inter-wiring insulating layer and the second inter-wiring insulating layer.

13. The semiconductor device according to claim 1, wherein a surface of the second inter-wiring insulating layer includes one of a silicon oxide film or a silicon nitride film.

14. The semiconductor device according to claim 1, further comprising a barrier layer between the first wiring layer and the first inter-wiring insulating layer, wherein the barrier layer includes one of titanium, tantalum, ruthenium, or cobalt.

15. The semiconductor device according to claim 1, wherein the first wiring layer projects from a bottom surface of the recess.

16. The semiconductor device according to claim 1, the second inter-wiring insulating layer has a planarized surface that is opposed to the recess.

17. A semiconductor device, comprising:
a first substrate that includes a first circuit having a first function;
a first inter-wiring insulating layer on the first substrate, wherein the first inter-wiring insulating layer includes a first wiring layer;
a second inter-wiring insulating layer on the first inter-wiring insulating layer, wherein the second inter-wiring insulating layer includes a second wiring layer;
a gap between the first inter-wiring insulating layer and the second inter-wiring insulating layer, wherein the gap is around the first wiring layer; and
a second substrate that includes a second circuit having a second function, wherein
the second function of the second circuit is different from the first function of the first circuit, and the second substrate is bounded to the first substrate such that a multi-layer wiring layer on the second substrate electrically couples with the second wiring layer included in the second inter-wiring insulating layer.

18. The semiconductor device according to claim 17, wherein
the first inter-wiring insulating layer includes a recess on a side opposite to the first substrate, and
the first wiring layer is in the recess.

19. The semiconductor device according to claim 18, wherein
the second inter-wiring insulating layer has a planarized surface that is opposed to the recess, and
the second inter-wiring insulating layer covers the recess.

20. The semiconductor device according to claim 17, further comprising a sealing film along an uneven shape of the first wiring layer and the first inter-wiring insulating layer.

\* \* \* \* \*